(12) United States Patent
Tiemeijer

(10) Patent No.: US 8,629,495 B2
(45) Date of Patent: Jan. 14, 2014

(54) HIGH FREQUENCY FIELD-EFFECT TRANSISTOR

(75) Inventor: Lukas Frederik Tiemeijer, Eindhoven (NL)

(73) Assignee: NXP, B.V., Eindhoven (NL)

(*) Notice: Subject to any disclaimer, the term of this patent is extended or adjusted under 35 U.S.C. 154(b) by 266 days.

(21) Appl. No.: 12/937,701

(22) PCT Filed: Apr. 15, 2009

(86) PCT No.: PCT/IB2009/051568
§ 371 (c)(1),
(2), (4) Date: Oct. 13, 2010

(87) PCT Pub. No.: WO2009/128035
PCT Pub. Date: Oct. 22, 2009

(65) Prior Publication Data
US 2011/0024835 A1     Feb. 3, 2011

(30) Foreign Application Priority Data

Apr. 15, 2008  (EP) ..................................... 08103544
Oct. 16, 2008  (EP) ..................................... 08166767

(51) Int. Cl.
*H01L 29/66*     (2006.01)

(52) U.S. Cl.
USPC ..................................... 257/335; 257/E21.435

(58) Field of Classification Search
USPC .................. 257/335, 340, 343, 409, E21.435; 438/279
See application file for complete search history.

(56) References Cited

U.S. PATENT DOCUMENTS

| 7,138,690 | B2* | 11/2006 | Xie et al. ...................... 257/401 |
| 2003/0102494 | A1* | 6/2003 | Akamine et al. ............... 257/202 |
| 2003/0160324 | A1 | 8/2003 | Dragon et al. |
| 2004/0022025 | A1* | 2/2004 | Yokogawa et al. ........... 361/695 |
| 2005/0269601 | A1 | 12/2005 | Tsubaki |
| 2005/0280087 | A1 | 12/2005 | Babcock et al. |
| 2006/0091480 | A1 | 5/2006 | Desko et al. |
| 2006/0175658 | A1 | 8/2006 | Lee |
| 2006/0175670 | A1 | 8/2006 | Tsubaki |
| 2009/0026539 | A1* | 1/2009 | Birner et al. .................. 257/336 |

FOREIGN PATENT DOCUMENTS

| WO | 2006/097893 A2 | 9/2006 |
| WO | 2009/130655 A2 | 10/2009 |

OTHER PUBLICATIONS

Grant, I. S., et al; "Electromagnetism—Chapter 9"; 25 pages.
Jackson, J. D.; "Classical Electrodynamics—Chapter 8"; Wiley India Pvt. Ltd.
International Search Report for Application PCT/IB2009/051568 (Apr. 15, 2009).

* cited by examiner

*Primary Examiner* — Shaun Campbell

(57) ABSTRACT

The invention relates to a field-effect transistor having a higher efficiency than the known field-effect transistors, in particular at higher operating frequencies. This is achieved by electrically connecting sources of a plurality of main current paths by means of a strap line (SL) being inductively coupled to a gate line (Gtl) and/or a drain line (Drnl) for forming an additional RF-return current path parallel to the RF-return current path in a semiconductor body (SB). The invention further relates to a field-effect transistor package, a power amplifier, a multi-stage power amplifier and a base station comprising such a field-effect transistor.

17 Claims, 23 Drawing Sheets

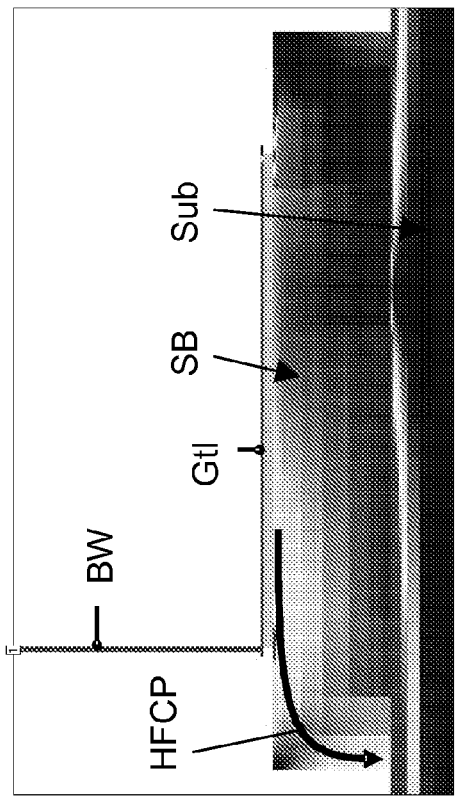
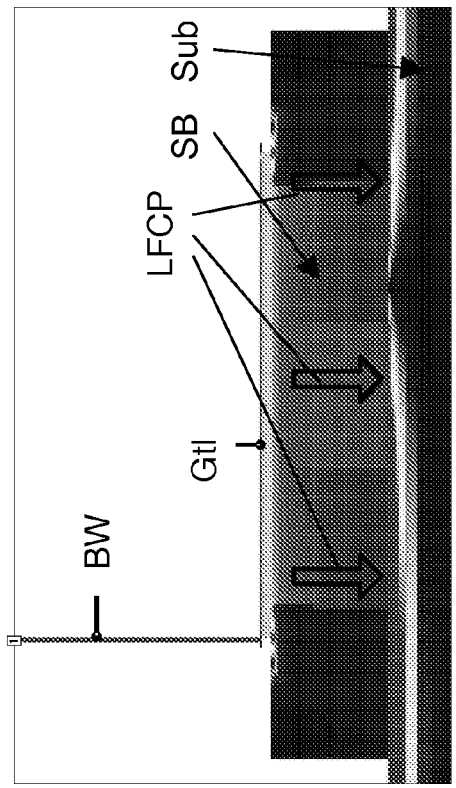
FIG. 5B
FIG. 5A

HIGH FREQUENCY FIELD-EFFECT TRANSISTOR

FIELD OF THE INVENTION

The invention relates to a field-effect transistor, a field-effect transistor package comprising such field-effect transistor, a power amplifier comprising such field-effect transistor, an integrated multi-stage power amplifier module comprising such field-effect transistor, and a cellular base station comprising such field-effect transistor.

BACKGROUND OF THE INVENTION

There is a significant market for power amplifier transistors for use in cellular base stations. In this application area the overall efficiency of the transistor is one of the most important discriminating factors in the market. Power amplifier transistors have to be able to withstand relatively high voltages (several tens of volts). Consequently, often discrete RF lateral double-diffused metal-oxide-semiconductor (LDMOS) transistors are used.

In a known discrete RF-LDMOS power amplifier transistor, the actual transistor is located on a silicon die. The package further includes a matching network comprising bondwires and a few discrete capacitors. A typical silicon die comprises a transistor having about 100 transistor fingers in parallel in order to obtain a large transistor width versus length (W/L) ratio. A transistor finger is here defined as a unit of 1 active region with one (shared) gate line and one (shared) drain line, such that the following expression applies for the total transistor width: $W_{tot}=W_{finger}*N_{finger}$, wherein $W_{tot}$ is the total transistor width, $W_{finger}$ is the total finger width, and $N_{finger}$ is the total number of transistor fingers. The transistor is connected through about 10 gate bondpads and about 20 drain bondpads. The source of the transistor is connected through a fairly low-resistivity (i.e. 10 mΩ·cm) substrate.

A problem with the known LDMOST power amplifier transistors is that their efficiency is still not optimal, in particular for high operating frequencies.

SUMMARY OF THE INVENTION

It is an object of the invention to provide a field-effect transistor having a higher efficiency, and is particularly suitable for high operating frequencies.

The invention is defined by the independent claims. The dependent claims define advantageous embodiments.

In a first aspect, the invention relates to a field-effect transistor comprising:
  a source terminal;
  an electrically conductive substrate being electrically connected to the source terminal;
  a semiconductor body being provided on the conductive substrate and comprising a transistor structure;
  a gate line, and
  a drain line,
wherein the transistor structure comprises a plurality of main current paths, each respective one of the main current paths comprising a respective drain, a respective source, and a respective channel in between the respective drain and respective source, wherein the respective channel is controlled by a respective gate, wherein each respective drain is electrically connected to the drain line, wherein each respective source is electrically connected to the conductive substrate, wherein each respective gate is electrically connected to the gate line, wherein the semiconductor body embodies an RF-return current path to the source terminal, wherein the sources of the plurality of main current paths are electrically connected by means of a strap line being inductively coupled to the gate line and/or drain line for forming an additional RF-return current path parallel to the RF-return current path in the semiconductor body.

The effect of the features of the field-effect transistor in accordance with the invention will be explained hereinafter. When the field-effect transistor is used at low operating frequencies, the impedances of the gate line and the semiconductor body are mainly determined by their resistance (which may be designed to be sufficiently low) and capacitance. The current through the gate line will then distribute over all main current paths in substantially equal quantities, mainly determined by the resistances of the paths through which the current flows. Once the current has reached the semiconductor body it will flow towards the electrically conductive substrate and eventually the source terminal according to the shortest path which is substantially in a direction perpendicular to the surface of the semiconductor body. When the operation frequency of the field-effect transistor is increased, the impedance of the gate line and the semiconductor body will be more dominated by the inductive components. The gate line will behave more like a transmission line above a plate, which means that for the RF current in the gate line, an RF return current will start to flow in an opposite direction in the semiconductor body. The gate line has a mutual inductive coupling with the semiconductor body which partially cancels out the partial inductance of the gate line. The same holds for the partial inductance of the semiconductor body. The partial inductance of a line/current path is the inductance which it would have had if the return-current path is infinitely far away. The transmission line effect will be such that the enclosed loop by the RF current is as small as possible, which minimizes the effective inductance of the gate line and the semiconductor body. A consequence of this is that the return current through the semiconductor body will flow close to the surface of the semiconductor body. The higher the operation frequency the more the current will confine itself near the surface. Above that, the RF return current will flow in opposite direction for as long as possible before it flows to the source terminal. This mechanism effectively lengthens the current paths and results in additional resistive losses. Above that at higher operating frequencies skin effects start to play a more dominant role. The above described skin effect results in so-called skin resistance, which will further increase the resistive losses. For the RF currents in the drain line the same problem as described above exists. At higher frequencies, substrate currents (source currents) at the surface of the semiconductor body will flow in a direction opposite to the current in the drain line.

In the field-effect transistor according to the invention the above described resistive losses are reduced by adding a source strap line that connects each respective source of each respective main current path. Furthermore, this strap line is placed such that it is inductively coupled to the gate line and/or drain line. By doing so an additional RF-return current path is formed that runs parallel to the RF-return current path in the semiconductor body offering an alternative route for the gate and drain return currents. The RF-return current will divide over both RF return-current paths in a ratio that depends on the impedance of both paths, but in any case the current through the semiconductor body is reduced, which reduces the resistive losses (through the skin resistances) in the semiconductor body and thus increases the efficiency of the transistor. It must be noted that the strap line may be placed such that it is inductively coupled with the gate line, with the drain line or with both. In the latter case, the efficiency is increased to the largest extent, because the semiconductor is (at least partially) bypassed for both the gate as well as the drain return currents.

In an embodiment of the field-effect transistor in accordance with the invention the strap line has a DC resistance which is substantially equal to or smaller than (such as between two and 0.5 times) the DC resistance of the gate and/or drain line to which it is inductively coupled. In that embodiment the RF-return current through the semiconductor body is better reduced.

In an embodiment of the field-effect transistor in accordance with the invention the strap line is arranged parallel to the gate line and/or the drain line. Parallel arrangement provides for the best inductive coupling and thus also the highest semiconductor bypassing effect (and thus higher transistor efficiency).

In an embodiment of the field-effect transistor in accordance with the invention the gate line and the drain line are arranged in parallel and the strap line is arranged in between the gate line and the drain line. This arrangement solves the earlier described RF-return current problem for both the gate as well as the drain return currents, because the strap line is coupled to both the gate line as well as the drain line.

An embodiment of the field-effect transistor in accordance with the invention comprises a plurality of gate lines and a plurality of drain lines, wherein each respective drain is electrically connected to a respective one of the plurality of drain lines, wherein each respective source is electrically connected to the conductive substrate, wherein each respective gate is electrically connected to a respective one of the plurality of gate lines. The maximum current which the field-effect transistor may deliver depends on the total width of the transistor, which in turn depends on the total number of main current paths which are arranged in parallel. Providing multiple gate lines and drain lines between which the main current paths are connected will further increase the maximum current capacity of the transistor.

In an embodiment of the field-effect transistor in accordance with the invention the plurality of gate lines and the plurality of drain lines are interleaved. Such an interleaved structure has the advantage that the gate and drain lines may be shared by adjacent main current paths (which are in different rows) which leads to higher area efficiency. In a further improved embodiment of the field-effect transistor in accordance with the invention the plurality of gate lines and the plurality of drain lines form part of interleaved fork structures.

An embodiment of the field-effect transistor in accordance with the invention further comprises a metallization stack on the semiconductor body, wherein the metallization stack comprises a top-metallization layer that is at a largest distance from the semiconductor body, wherein the gate line and the drain line have been laid out in the top-metallization layer. The top-metallization layer generally has a lower resistance which is advantageous for the transmission line effects.

In an embodiment of the field-effect transistor in accordance with the invention the strap line has been laid out in the top-metallization layer. The lower resistance of the top-metallization layer increases the effectivity of the strap line. More return-current will flow through the strap line.

In an embodiment of the field-effect transistor in accordance with the invention a first spacing between the strap line and the drain line is equal to a second spacing between the strap line and the gate line. In this embodiment the effect of the strap line on the drain line and gate line can be made equal. Moreover, an advantage of this embodiment is that the strap line can be so wide that there is a minimum technology spacing left between the respective lines which leads to the highest coupling and the lowest resistance for the strap line.

In an embodiment of the field-effect transistor in accordance with the invention the first spacing between the strap line and the drain line is smaller than the second spacing between the strap line and the gate line. This embodiment is particularly advantageous in case the drain line return currents are dominant of the gate line return currents.

In an embodiment of the field-effect transistor in accordance with the invention the strap lines has been laid out in a lower metallization layer that is at a shorter distance from the semiconductor body than the top-metallization layer. This may be the second metallization layer for example. An advantage of this embodiment is that the strap line has been laid out closer to the source of the transistor which reduces the resistance of that path.

In an embodiment of the field-effect transistor in accordance with the invention the strap line has been laid out in the lower metallization layer substantially above the gates of the transistor structure for shielding the gates from the drain line. Shielding the gates from the drain line reduces the so-called feedback capacitance of the transistor which improves the stability.

The embodiments having a strap line in the top-metallization layer and the embodiments having a strap line in the lower metallization layers can be easily combined. More details about this combination are given in the description of the Figures.

An embodiment of the field-effect transistor in accordance with the invention comprises a gate line connection, a drain line connection, and strap line connections, wherein the gate line connection and/or the drain line connection are formed as a coplanar waveguide using the strap line connections as RF-return current path. The effect of the strap line in this embodiment (providing an alternative RF return-current path parallel to the RF return-current path in the semiconductor body) is effectively increased. This will lead to smaller signal losses over the gate and drain lines. The connections are generally provided outside the area of the plurality of main current paths.

An embodiment of the field-effect transistor in accordance with the invention comprises a co-planar waveguide based global ground network to which ends of the strap line connections are connected. Signal losses are further reduced in such embodiment.

In an embodiment of the field-effect transistor in accordance with the invention the connection between each respective one of the sources is formed by a deep well contact extending from the surface of the semiconductor body to the conductive substrate, and having a same conductivity type as each respective one of the sources.

An embodiment of the field-effect transistor in accordance with the invention comprises an electrically conductive source plate serving as an external source connection for the transistor onto which the electrically conductive substrate is mounted to.

An embodiment of the field-effect transistor in accordance with the invention comprises a further source terminal at the surface of the semiconductor body, the further source terminal being connected to the strap line for allowing the RF-return current to further bypass the semiconductor body when the further source terminal is externally electrically connected to the source terminal. Bypassing RF-return path in the semiconductor body to a greater extent further reduces the resistive losses in the semiconductor body and thus further increases the efficiency.

An embodiment of the field-effect transistor in accordance with the invention comprises an off-chip connection between the further source terminal and the conductive source plate. In an embodiment of the field-effect transistor in accordance with the invention the off-chip connection is a bondwire. The off-chip connection may be provided on the gate side, the drain side or on both sides.

In an embodiment of the field-effect transistor in accordance with the invention the transistor structure in the semiconductor body has a lateral configuration. The invention is especially beneficial for lateral configurations, because in those configurations the source region lies at the surface of the semiconductor body, which is the place where the substrate RF-return current tends to flow. The current path towards the strap line is thus shorter which leads to lower losses.

In an embodiment of the field-effect transistor in accordance with the invention a gate dielectric is provided between the gate and the channel of each main current path to obtain a MOS transistor.

In an embodiment of the field-effect transistor in accordance with the invention the drain each respective one of the plurality of main current paths comprises a drain extension at a side facing the channel for forming a resistance in series with the channel to obtain an LDMOS transistor structure. LDMOS transistors are capable of handling very high voltages on their drain, which make them very suitable for high-power transistor applications.

In a second aspect the invention relates to a field-effect transistor package comprising:

the field-effect transistor in accordance with the invention;
an electrically insulating material provided on the electrically conductive source plate;
an electrically conductive drain plate provided on the electrically insulating material to serve as external drain connection for the transistor;
an electrically conductive gate plate to serve as external gate connection for the transistor;
a plurality of lumped capacitances, and
a plurality of electrical connections between the plates and the field-effect transistor, wherein parasitic inductance of the plurality of electrical connections forms together with the plurality of lumped capacitances impedance matching networks.

This configuration constitutes a discrete transistor.

In a third aspect the invention relates to a power amplifier comprising the field-effect transistor in accordance with the invention, and optionally comprises: one ore more amplification stages connected by one or more suitable L/C impedance matching networks. Such power amplifier will benefit from the higher efficiency of the field-effect transistor and may thus operate at higher frequencies.

In a fourth aspect the invention relates to an integrated multi-stage power amplifier module comprising one or more field-effect transistors in accordance with the invention, an impedance matching circuitry comprising spiral inductors and capacitors, and biasing circuitry. Such multi-stage power amplifier will benefit from the higher efficiency of the field-effect transistor and may thus operate at higher frequencies. The multi-stage power amplifier is preferably integrated on a single silicon die.

In a fifth aspect the invention relates to a cellular base station comprising the MOS transistor in accordance with the invention and/or the power amplifier in accordance with the invention.

These and other aspects of the invention are apparent from and will be elucidated with reference to the embodiments described hereinafter.

BRIEF DESCRIPTION OF THE DRAWINGS

In the drawings:

FIG. 2b shows a schematic cross-sectional view of the RF-LDMOS power amplifier transistor of FIG. 2a;

FIG. 2c shows an equivalent circuit of the RF-LDMOS power amplifier transistor of FIG. 2a;

FIG. 5a shows a Sonnet EM analysis of the source current density in the substrate at a frequency of 100 MHz, wherein the cross sectional view is taken on line AA' in FIG. 3;

FIG. 5b shows a Sonnet EM analysis of the source current density in the substrate at a frequency of 2 GHz, wherein the cross sectional view is taken on line AA' in FIG. 3;

FIGS. 14a and 14b show Sonnet EM models used to evaluate the impact of the strap lines in accordance with the invention when used in a multi-stage amplifier module where the these straps can be connected to a co-planar waveguide based global ground interconnect network realized in the top metal level, wherein FIG. 14a represents a reference transistor and FIG. 14b a transistor in accordance with the invention;

DETAILED DESCRIPTION OF THE PREFERRED EMBODIMENT

The invention aims at providing a field-effect transistor with a higher efficiency at high frequencies, i.e. a lower power loss. In this description the problem which the invention aims to solve will be illustrated on the basis of FIGS. 1 to 6b.

Throughout this description the term "interconnect layer" should be considered as synonym to "metallization layer" or "metal layer". Both terms are used interchangeably and have to be interpreted as the layer comprising conductors, the insulating layer in which the conductors are embedded, and any vias (=contacts) to underlying layers. These terms are well-known to the person skilled in the art of semiconductor technology.

Figure 1A:
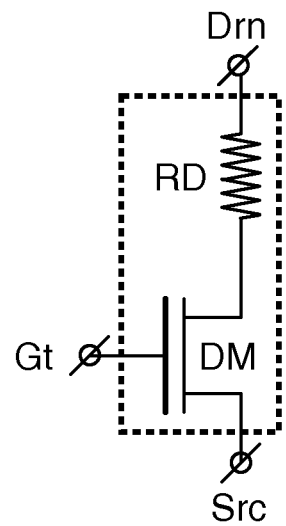
FIG. 1a shows an equivalent circuit of a DMOS transistor.

FIG. 1a shows an equivalent circuit of a so-called double-diffused metal-oxide-semiconductor transistor (DMOST or DMOSFET). The DMOST is represented by the dashed box having a gate Gt, drain Drn, and source terminal Src. An MOS transistor is changed into a DMOST by adding a so-called drain extension to the transistor which results in a DMOST. This drain extension results in an additional drain resistance RD which is located in the main current path of the MOS transistor DM. As a result of this additional resistance RD the drain-source maximum voltage which may be applied to the drain Drn may be increased up to several tens of volts.

A major part of the description will be discussed on the basis of DMOSFETs. Nevertheless, the problems solved by the invention are not restricted to that type of transistor only. DMOS transistors are generally used in high-voltage applications. MOS transistors are examples of field-effect transistors (MOSFET). An alternative field-effect transistor is the junction field-effect transistor (JFET). A major difference between both types of transistors is the presence of a gate dielectric between the gate electrode and the channel in a MOSFET, while this dielectric is absent in the junction field-effect transistor. A result of this difference is that a MOSFET does not have a DC gate current (with the exception of a possible gate leakage current in case of very thin gate dielectrics). It must be noted that in any case, at higher operating frequencies both types of FETs have AC gate currents. As will be elaborated in this description these AC gate currents may, starting from a certain high frequency, result in substrate return currents, which results in additional power losses. Besides the MOSFET and JFET, other types of FETs do exist as well. It will become apparent from the description that the invention may be applied without modification in those transistor types as well.

Figure 1B:
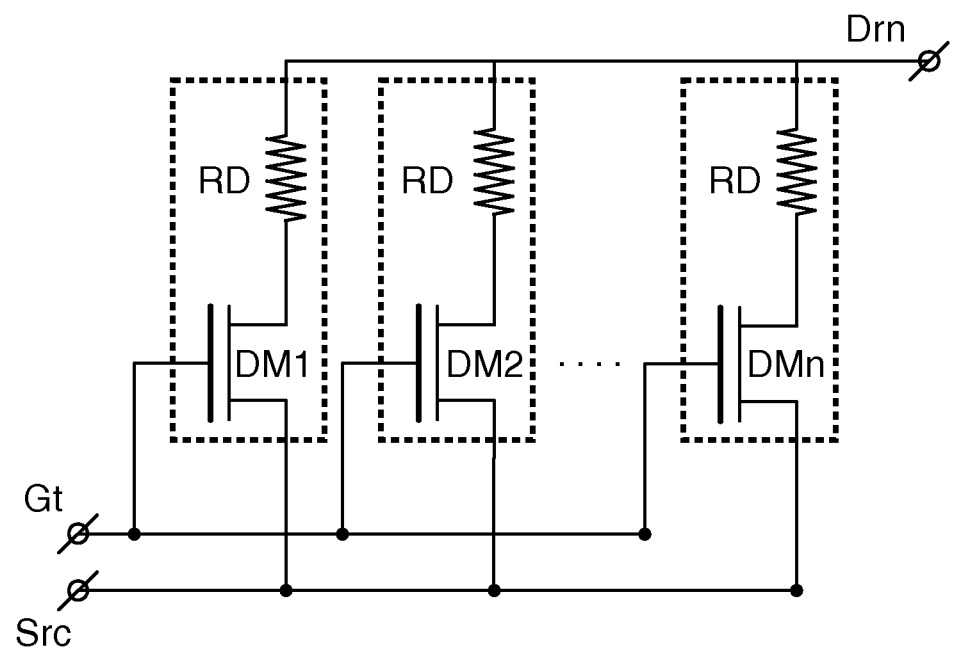
FIG. 1b shows a more detailed equivalent circuit of a DMOS transistor when implemented in a semiconductor device.

In order to increase the maximum current carrying capacity of the transistor several transistors may be connected in parallel as is illustrated in FIG. 1b. A plurality of main current paths of the MOS type DM1, DM2, DMn are connected between the drain terminal Drn and the source terminal Src each having its own drain series resistance RD. Even though the schematic seems to suggest otherwise the plurality of main current paths (each having its own source, drain, channel, and gate) may also be merged so as to form a very wide main current path. Both cases functionally provide a transistor having a large width and thus a large current carrying capacity. Even if a large transistor is made, still such large transistor is generally connected using a plurality of contacts. Considering those contacts still a plurality of main current paths may be identified.

Furthermore, in FIG. 1b the electrical connections connecting the drains, source and gates together are presented as ideal conductors having no impedance. In reality however such connecting lines have impedances which are built up out of parasitic resistances, capacitances, and inductances. And, in particular at higher frequencies, the inductances and capacitances play a significant role in the total impedance, such that transmission line effects may occur.

Figure 2A:
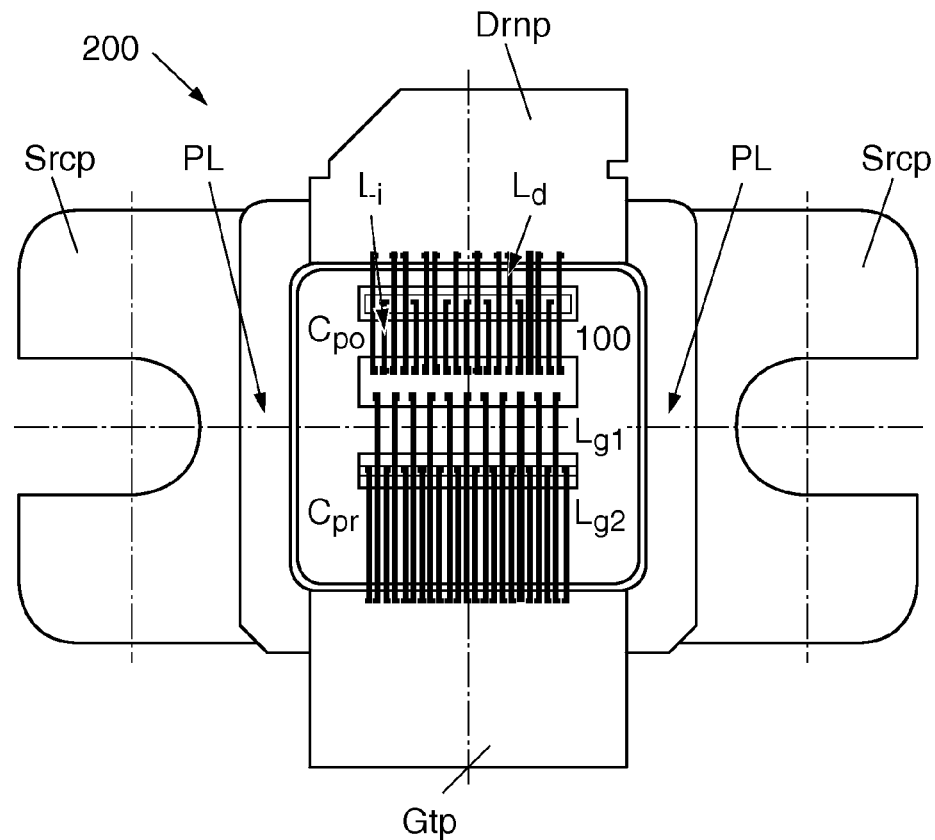
FIG. 2a shows a top view of an RF-LDMOS power amplifier transistor.
Figure 2B:
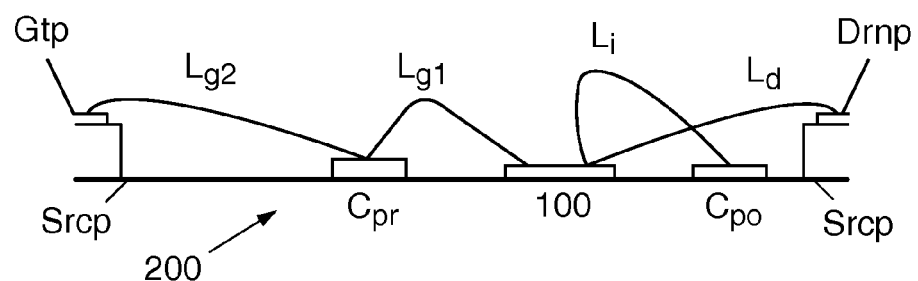
Figure 2C:
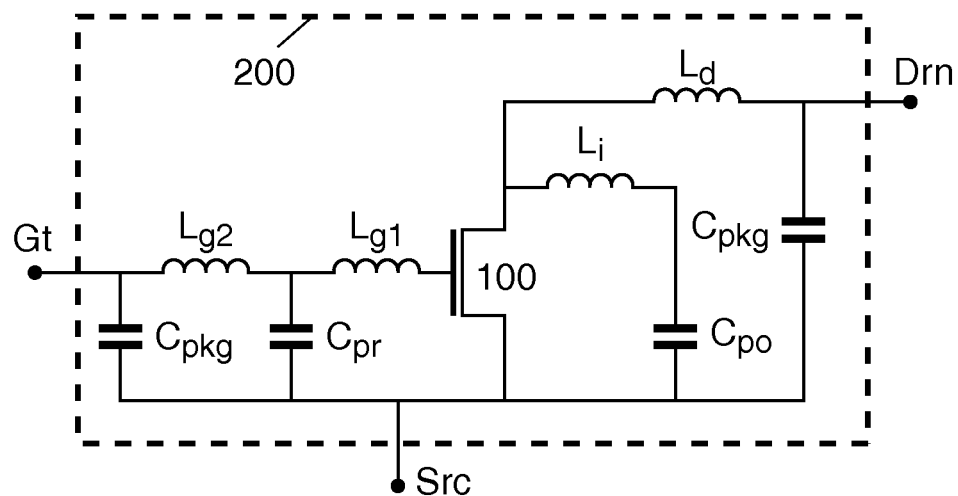

FIG. 2a shows a top view of an RF-LDMOS power amplifier transistor 200. FIG. 2b shows a schematic cross-sectional view of the RF-LDMOS power amplifier transistor 200 of FIG. 2a. The transistor 200 comprises an electrically conductive source plate Srcp, a plastic ring PL provided on the source plate Srcp. The actual transistor die 100 is located in the middle of the source plate Srcp in the plastic ring PL and directly on the source plate Srcp. On one side of the ring an electrically conductive drain plate Drnp has been mounted and on the opposing side an electrically conductive gate plate Gtp. On the source plate Srcp there is further provided discrete matching capacitors $C_{pc}$ and $C_{pr}$ which are connected to the die and the drain plate Srcp and gate plate Gtp with bondwires as illustrated in the Figure. These bondwires have parasitic inductances $L_i$, $L_d$, $L_{g1}$, $L_{g2}$ which are exploited to form together with the matching lumped capacitances $C_{pc}$ and $C_{pr}$ impedance matching networks, which is illustrated in FIG. 2c. FIG. 2c shows an equivalent circuit of the RF-LDMOS power amplifier transistor of FIG. 2a.

Figure 3:
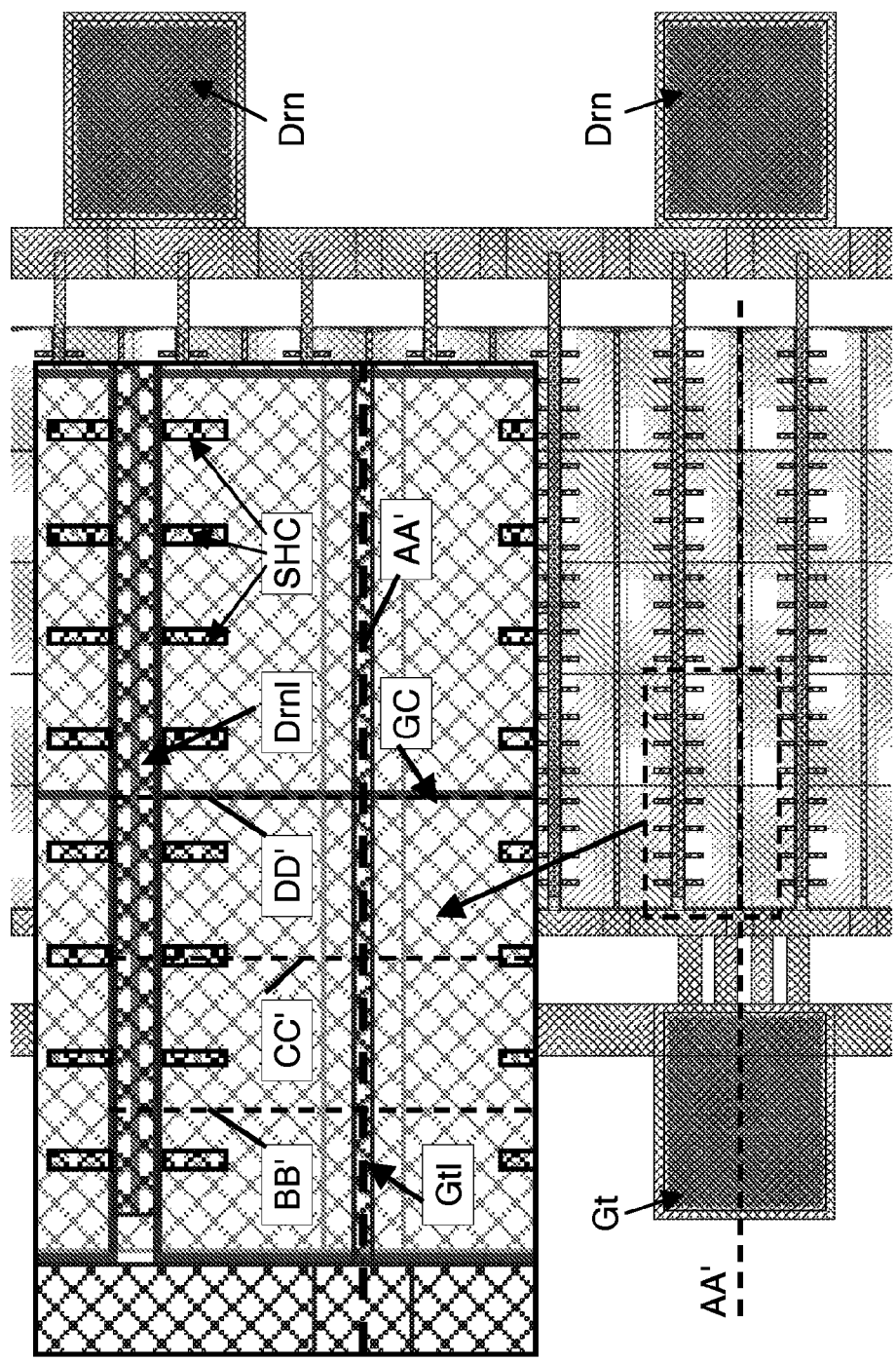
FIG. 3 shows a top view of a layout of the transistor die of the RF-LDMOS power amplifier transistor in FIGS. 2a and 2b.

FIG. 3 shows a top view of a layout of the transistor die of the RF-LDMOS power amplifier transistor in FIGS. 2a and 2b. A typical transistor die contains about 100 transistor fingers in parallel, which are connected through about 10 gate bondpads and about 20 drain bondpads. A layout of such a transistor is shown in FIG. 3. The source is connected at the backside of the die through a fairly low resistivity (10 mohm·cm) substrate (which may be directly mounted on the electrically conductive source plate). Transistors of this kind (source connection on backside of die) are known to have power losses due to return currents (source currents) in the substrate. And it will be explained later in this description that the invention solves these power loss problems for these kind devices in an adequate way. Nevertheless, also devices of another type may benefit from the invention. FIG. 3 further shows a gate bondpad Gt, and two drain bondpads Drn. The gate bondpad Gt is connected to a fork structure having gate fingers, i.e. gate lines Gtl. The drain bondpad Drn is connected to a fork structure having drain fingers Drnl. Both fork structures are arranged in an interleaved fashion, wherein the transistors are arranged in a direction perpendicular to the fingers. Most drain fingers Drnl and gate fingers Gtl (except those on the edge of the transistor layout) are connected to two transistor rows. Such an arrangement provides for a very compact layout. FIG. 3 further shows some dashed lines indicating the positions where a cross section has been made. Cross sectional view AA' is illustrated in FIGS. 5a and 5b and cross-sectional views BB', CC', DD' have been combined into one schematic view in FIG. 4. The rectangular polygons near the drain line represent so-called shield connections SHC. This will be elaborated on in the next Figure.

Figure 4:
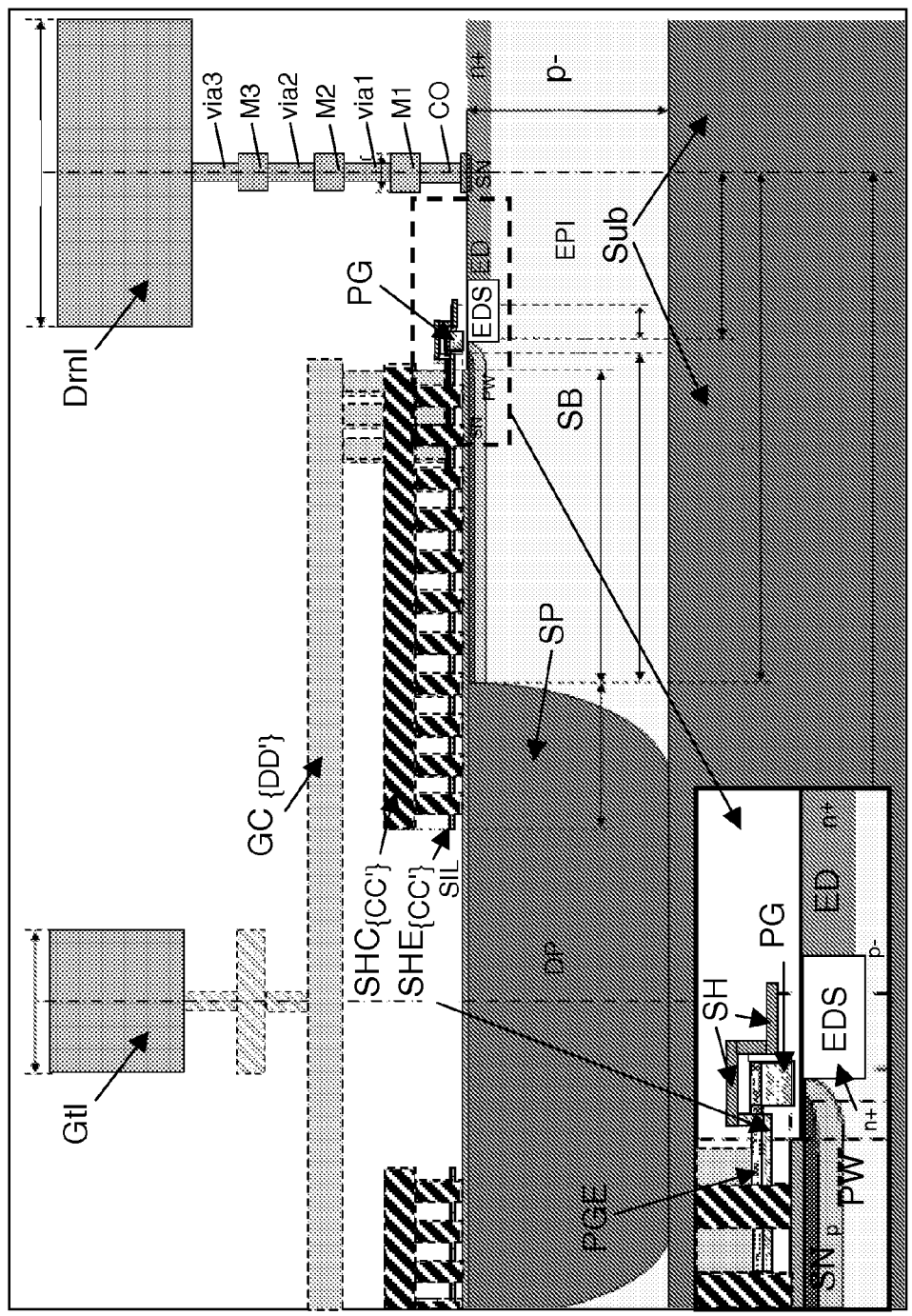
FIG. 4 shows a combined schematic cross-sectional view of the transistor die of the RF-LDMOS power amplifier transistor through lines BB', CC', and DD' in FIG. 3.

FIG. 4 shows a combined schematic cross-sectional view of the transistor die of the RF-LDMOS power amplifier transistor through lines BB', CC', and DD' in FIG. 3. In this Figure, for some parts it has been mentioned in which of the cross-sectional views in FIG. 3 they are visible. Where this has not been mentioned the respective part appears in all of the cross-sectional views. It must be noted that the design illustrated in this Figure is just an example. Various variations and alterations are possible. FIG. 4 also comprises a zoom view of the transistor region, indicated by the dashed box, the arrow and the enlarged picture, which has been placed in the lower left corner of the Figure for clarity reasons. It must be noted that this does not mean that these features are located in that position.

The transistor comprises an electrically conductive substrate Sub, which may comprise a low-ohmic heavily doped n-type semiconductor substrate for example. Alternatively, it may be any kind of low-ohmic substrate. The purpose of this layer is to "collect" all source currents and guide them to the source plate (Srcp of FIG. 2a). On the substrate a semiconductor body SB is provided, which may be a so-called epi-layer EPI, in this case of the p-type and having a low-doping concentration. The doping concentration of the low-ohmic substrate may be between $10^{19}$ and $10^{20}$ atoms per cm$^3$ for example, and the doping concentration of the epi-layer approximately $5*10^{15}$ atoms per cm$^3$.

The semiconductor body may comprise any one of the following semiconductor materials and compositions like silicon (Si), germanium (Ge), silicon germanium (SiGe), gallium-arsenide (GaAs) and other III-V compounds like indium-phosphide (InP), cadmium sulfide (CdS) and other II-VI compounds, or combinations of these materials and compositions.

At a surface of the semiconductor body SB a relatively shallow pwell PW is provided which mainly serves to increase the doping at the location of the channel of the transistor to be formed. In the pwell PW an even more shallow nwell SN is provided which serves as a source region for the transistor to be formed. In this example embodiment a thin low-ohmic silicide layer SIL is provided on the source region for reducing its sheet resistance. At the surface, next to the pwell a so-called second extended drain EDS is formed adjacent an extended drain ED. Both the extended drain ED and the second extended drain are highly doped n-type regions. The extend drain ED and the second extend drain EDS together form the so-called drain resistance RD (FIG. 1) of the LDMOS transistor. The extended drain ED is connected to a drain line Drnl (which has been laid out in the top metal layer in this example) through a stack of contacts/vias CO, via1, via2, via3 and polygons of metal M1, M2, M3. Between the contact CO and the extended drain ED a silicide layer may be provided.

The source nwell SN is electrically contacted by the silicide layer SIL formed everywhere except in the gate and extended drain regions, which in turn is connected to the substrate Sub via a highly doped p-type deep substrate plug DP that extends completely through the semiconductor body SB. Right above the pwell forming the channel in between the source SN and the drain EDS a gate electrode PG, here of polysilicon material, is provided. The gate electrode PG is spaced apart from the semiconductor body by a gate dielectric (MOS transistor). In order to reduce the resistance of the gate electrode PG a silicide layer may be provided on top of it. At certain locations the gate electrode PG is provided with gate extensions PGE (only the silicide layer of these extensions is visible in the zoom view in 4). The gate extensions PGE are then further connected by means of a gate connection GC to a gate line Gtl in the top metal layer, wherein the gate connection GC in this example is formed of a stack of contacts/vias and polygons of metal. In this particular example the gate connection GC comprises in the second metallization layer M2 a relatively long connection. Furthermore, this connection extends from the gate line Gtl in two directions, because the structure has been laid out in a mirrored fashion on the other side of the gate line Gtl. It must be noted that especially this kind of design may be heavily varied. In this particular case the actual transistor structure has been laid out close to the drain line Drnl, which results in the design as illustrated in 4. Alternatively, the transistor structure could have been placed more in between in the gate line Gtl and drain line Drnl, or it could have been placed close to the gate line. Nevertheless, the configuration of 4 does have a clear advantage as well as will be elaborated on in 9.

Also, the configuration leaves a lot of space for a shield layer and its connection. Right above the gate electrode PG, but spaced apart and electrically insulated there from, an electrically conductive shield layer SH is provided which serves to reduce the parasitic gate-drain capacitance which has a negative influence on the high-frequency operation when it gets too high. This shield layer SH may be a silicide layer for example. At certain locations along the gate electrode PG, this shield layer SH is provided with shield extensions SHE which also extend above the source silicide layer. It must be noted that these shield extensions SHE are not provided on the same locations along the gate electrode PG as the gate extensions PGE (see the CC' and DD' tags behind the reference numerals). The connection SHC between the shield extensions SHE and the source silicide layer are created by a metal track in the first metallization layer M1 which is provided with a plurality of contacts that "punch" through the shield layer and extend towards the lower silicide layer.

The gate lines Gtl and drain lines Drnl are laid out in the top metallization layer, however this is not essential. An advantage of the top metallization layer is its lower resistance (thicker layer, wider tracks) and its lower parasitic capacitance to the substrate.

The device illustrated in . 4 constitutes a so-called lateral DMOS transistor (LDMOST) and in this embodiment is provided with an gate dielectric of 25 nm, an effective channel length of 0.3 μm. Furthermore, the pitch between the gate line Gtl and the drain line Drnl is 35 μm.

FIG. 5a shows a Sonnet EM analysis of the source current density in the substrate at a frequency of 100 MHz, wherein the cross sectional view is taken on line AA' in . 3 . . . 5b shows a Sonnet EM analysis of the source current density in the substrate at a frequency of 2 GHz, wherein the cross sectional view is taken on line AA' in . 3. Sonnet is a software packet that is capable of simulating high-frequency behavior of 3D structures. More information on Sonnet can be found at: http://www.sonnetusa.com/.

FIGS. 5a and 5b show a schematic representation of the gate line Gtl that is provided above the semiconductor body SB, which is provided on the electrically conductive substrate Sub. The gate line Gtl is connected at the left side through a bondwire BW via a bondpad (not shown). In 5a the EM analysis was done at 100 MHz and the low-frequency current path LFCP is mainly perpendicular to the substrate. The current distribution is mainly determined by the resistance of the semiconductor body SB. In 5b the EM analysis was done at 2 GHz and, due to the inductive effects, the high-frequency current path HFCP in the semiconductor body SB tends to go in an opposite direction than the current in the gate line Gtl. Also the high-frequency current path HFCP tends to confine (skin-effects) in the upper part of the semiconductor body SB. Both effects result in undesirable power losses (lower efficiency of the transistor).

Figure 6A:
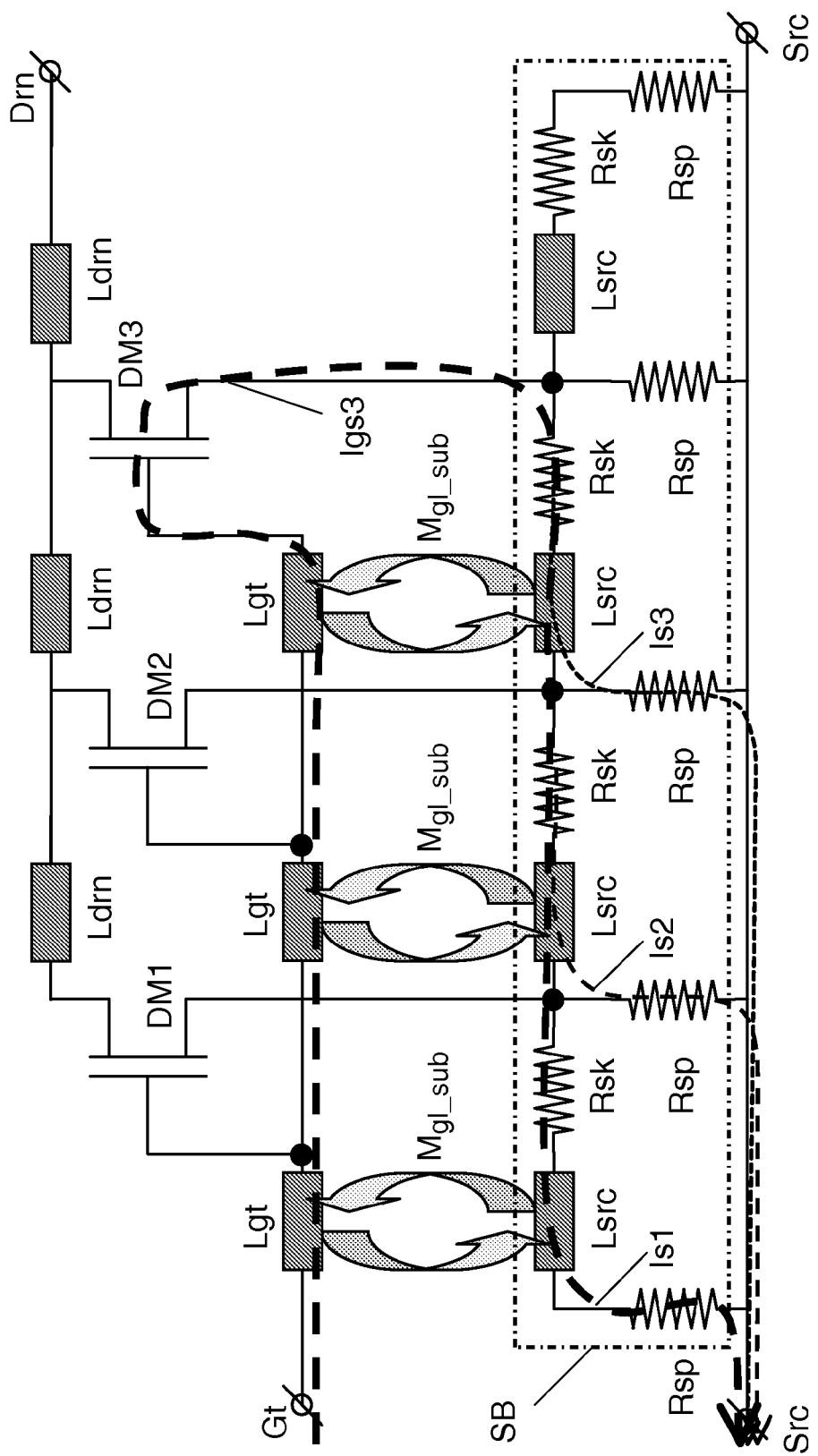
FIG. 6a shows an equivalent circuit which illustrates power losses due to gate line return current problems in the substrate of the LDMOS transistor of FIG. 3 at higher operating frequencies.

FIG. 6a shows an equivalent circuit which illustrates power losses due to gate line return current problems in the substrate of the LDMOS transistor of 3 at higher operating frequencies, for example 2 GHz. 6b shows an equivalent circuit which illustrates power losses due to drain line return current problems in the substrate of the LDMOS transistor of 3 at higher operating frequencies, for example 2 GHz·s. 6a and 6b show a plurality of main current paths DM1, DM2, DM2 connected between a drain line connected to a drain terminal Drn, a gate line connected to a gate terminal Gt, and a semiconductor body SB connected to a low-ohmic electrically conductive substrate represented by a line connected between source terminals Src. The gate line is modeled as a distributed gate inductance Lgt and the drain line is modeled as a distributed drain inductance Ldrn. The semiconductor body SB has been modeled as a distributed source inductance Lsrc in series with a distributed skin resistance Rsk (current confinement at the surface). The substrate plugs which connect the source of the main current paths DM1, DM2, DM3 have also been modeled as a plurality of substrate plug resistances Rsp. Although the equivalent circuit shows a plurality of main current paths DM1, DM2, DM3, functionally the circuit behaves as a single large transistor.

A problem which occurs in the LDMOS transistor of 3 will be discussed on the basis of 6a. This Figure illustrates the high-frequency gate to source current Igs3 for one of the main current paths DM3, which is the path which suffers from the problem the most. When the transistor is used at low operating frequencies, the impedances of the gate line and the semiconductor body SB are mainly determined by their resistance (which may be designed to be sufficiently low) and capacitance. The current through the gate line will then distribute over all main current paths DM1, DM2, DM3 in substantially equal quantities, mainly determined by the resistances Rsp of the paths through which the current flows. Once the current has reached the semiconductor body SB it will flow towards the electrically conductive substrate and eventually the source terminal Src according to the shortest path which is substantially in a direction perpendicular to the surface of the semiconductor body SB. When the operation frequency of the field-effect transistor is increased, the impedance of the gate line and the semiconductor body SB will be more dominated by the inductive components Lgt, Lsrc. The gate line will behave more like a transmission line above a plate, which means that for the RF current in the gate line, an RF return current will start to flow in an opposite direction in the semiconductor body SB. The gate line has a mutual inductive coupling $M_{g1\_sub}$ with the semiconductor body SB which partially cancels out the partial inductance Lgt of the gate line. The same holds for the partial inductance Lsrc of the semiconductor body SB. The partial inductance Lgt, Lsrc of a line/current path is the inductance which it would have had if the return-current path is infinitely far away. The transmission line effect will be such that the enclosed loop by the RF current Igs3 is as small as possible, which minimizes the effective inductance of the gate line and the semiconductor body SB. A consequence of this is that the return current through the semiconductor body SB will flow close to the surface of the semiconductor body SB. The higher the operation frequency the more the current will confine itself near the surface. Above that, the RF return current Igs3 will flow in opposite direction for as long as possible before it flows to the source terminal Src. In practice this means that the current through the substrate plugs Is1, Is2, Is3 get larger towards the end of the transmission line, i.e. the substrate currents becomes inhomogeneously distributed. This mechanism effectively lengthens the current paths and results in additional resistive losses. Above that at higher operating frequencies skin effects start to play a more dominant role Skin effects result in so-called skin resistance Rsk, which will further increase the resistive losses.

Figure 6B:
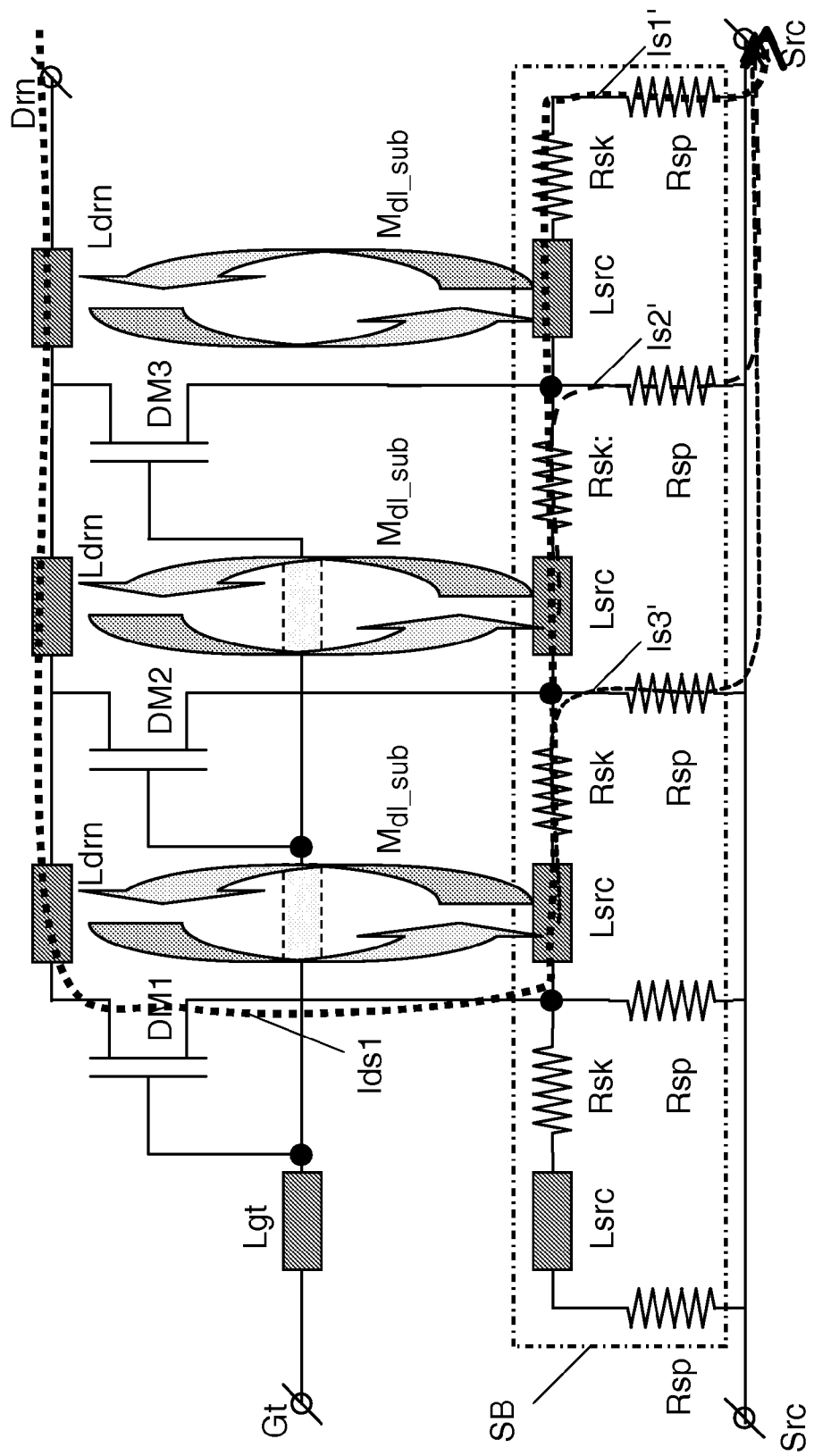
FIG. 6b shows an equivalent circuit which illustrates power losses due to drain line return current problems in the substrate of the LDMOS transistor of FIG. 3 at higher operating frequencies.

For the RF currents in the drain line a similar problem as described above exists which will be discussed on the basis of FIG. 6b. This Figure illustrates the high-frequency gate to source current Ids1 for one of the main current paths DM1, which is the path which suffers from the problem the most. When the transistor is used at low operating frequencies, the impedances of the drain line and the semiconductor body SB are mainly determined by their resistance (which may be designed to be sufficiently low) and capacitance. The current through the drain line will then distribute over all main current paths DM1, DM2, DM3 in substantially equal quantities, mainly determined by the resistances Rsp of the paths through which the current flows. Once the current has reached the semiconductor body SB it will flow towards the electrically conductive substrate and eventually the source terminal Src according to the shortest path which is substantially in a direction perpendicular to the surface of the semiconductor body SB. When the operation frequency of the field-effect transistor is increased, the impedance of the drain line and the semiconductor body SB will be more dominated by the inductive components Ldrn, Lsrc. The drain line will behave more like a transmission line above a plate, which means that for the RF current in the drain line, an RF return current will start to flow in an opposite direction in the semiconductor body SB. The drain line has a mutual inductive coupling $M_{d1\_sub}$ with the semiconductor body SB which partially cancels out the partial inductance Ldrn of the drain line. The same holds for the partial inductance Lsrc of the semiconductor body SB. The partial inductance Ldrn, Lsrc of a line/current path is the inductance which it would have had if the return-current path is infinitely far away. The transmission line effect will be such that the enclosed loop by the RF current Ids1 is as small as possible, which minimizes the effective inductance of the drain line and the semiconductor body SB. A consequence of this is that the return current through the semiconductor body SB will flow close to the surface of the semiconductor body SB. The higher the operation frequency the more the current will confine itself near the surface. Above that, the RF return current Igs3 will flow in opposite direction for as long as possible before it flows to the source terminal Src. In practice this means that the current through the substrate plugs Is1', Is2', Is3' get larger towards the end of the transmission line (opposite direction than that of FIG. 6a), i.e. the substrate currents become inhomogeneously distributed. This mechanism effectively lengthens the current paths and results in additional resistive losses. Above that at higher operating frequencies skin effects start to play a more dominant role Skin effects result in so-called skin resistance Rsk, which will further increase the resistive losses.

Figure 7A:
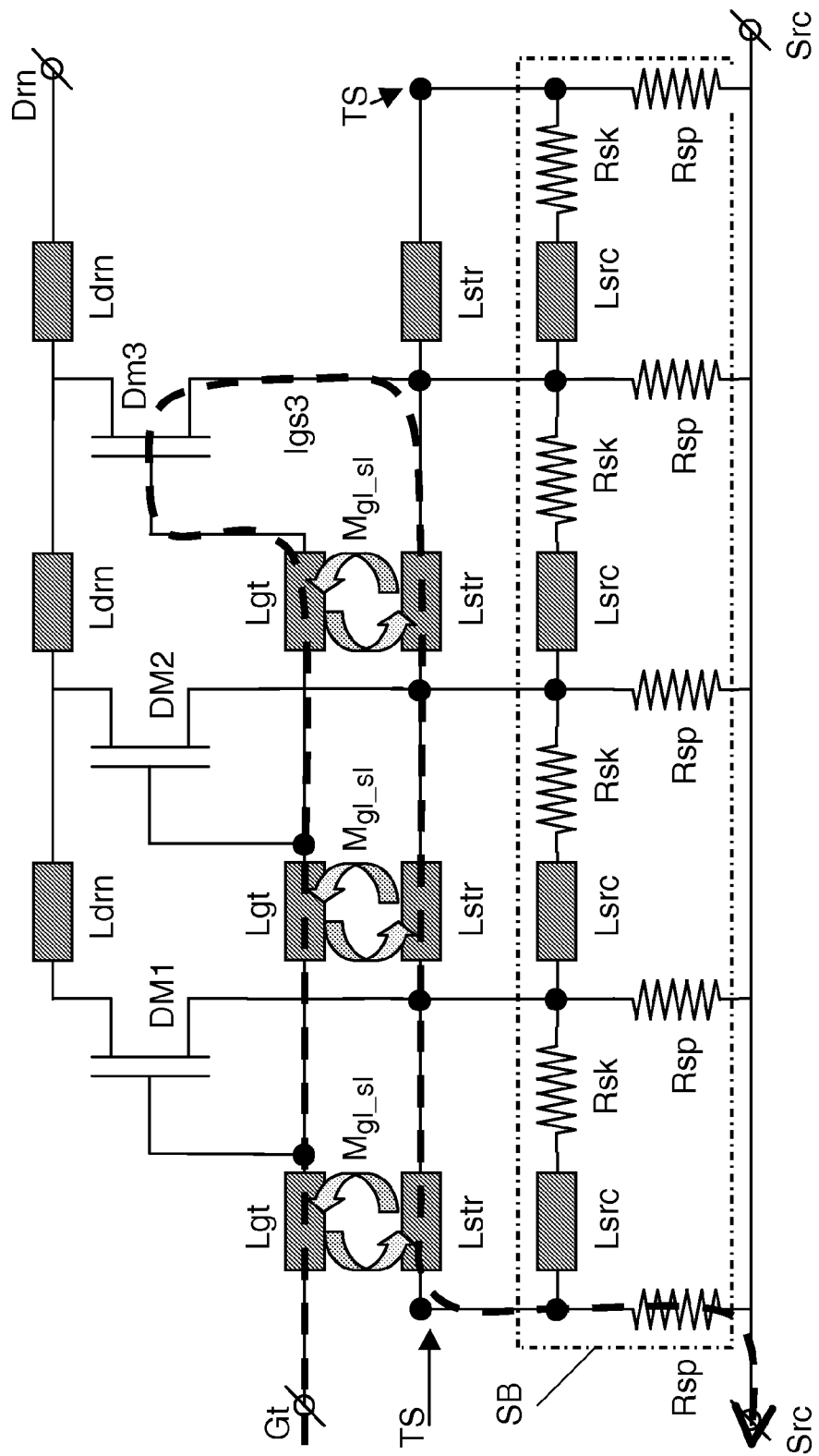
FIG. 7a shows an equivalent circuit of an embodiment of the field-effect transistor in accordance with the invention in which power losses caused by the gate line return current problems in the substrate at higher operating frequencies are resolved.
Figure 7B:
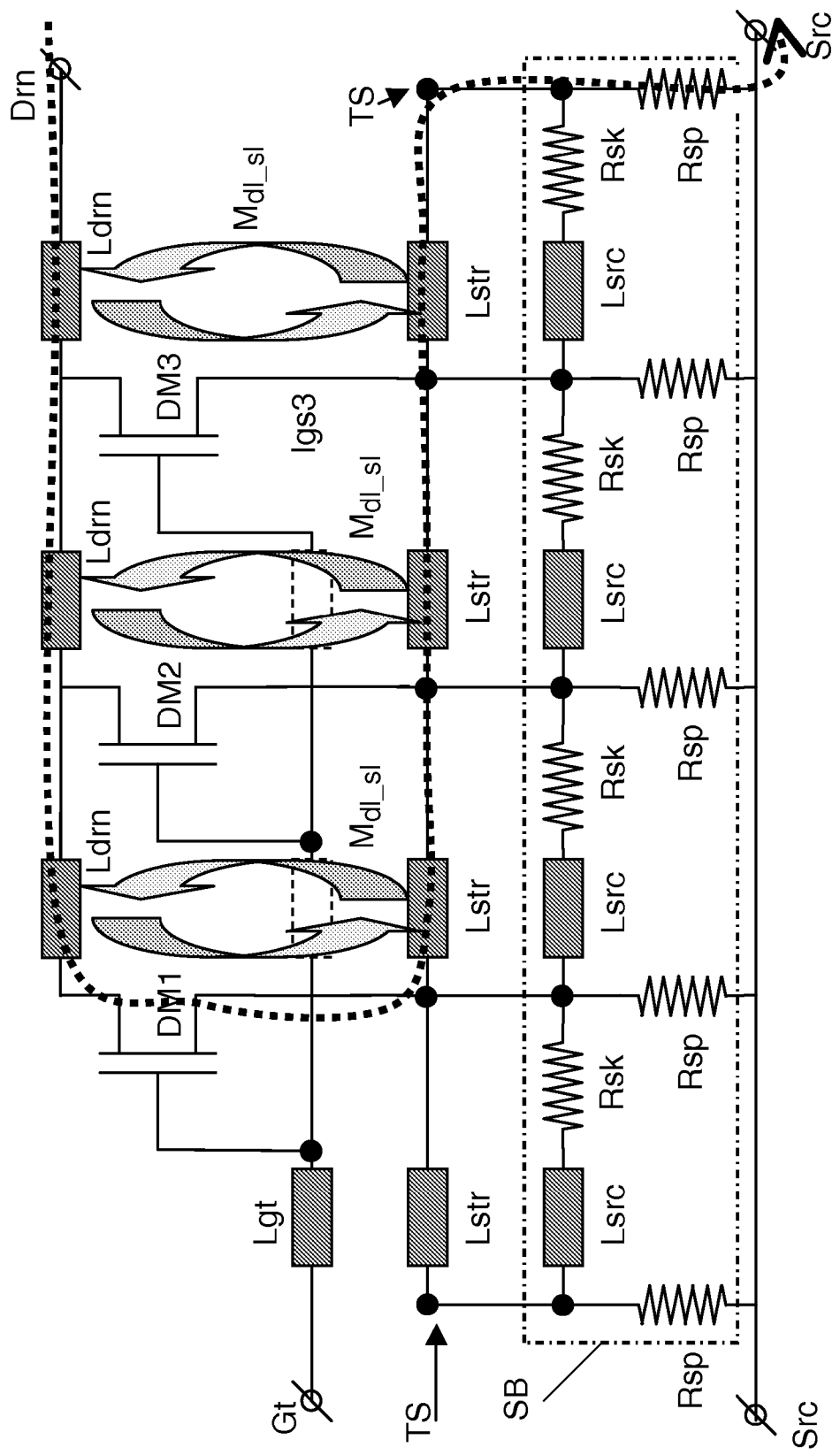
FIG. 7b shows an equivalent circuit of the same embodiment of the field-effect transistor as FIG. 7a in which power losses caused by the drain line return current problems in the substrate at higher operating frequencies are also resolved.
Figure 8:
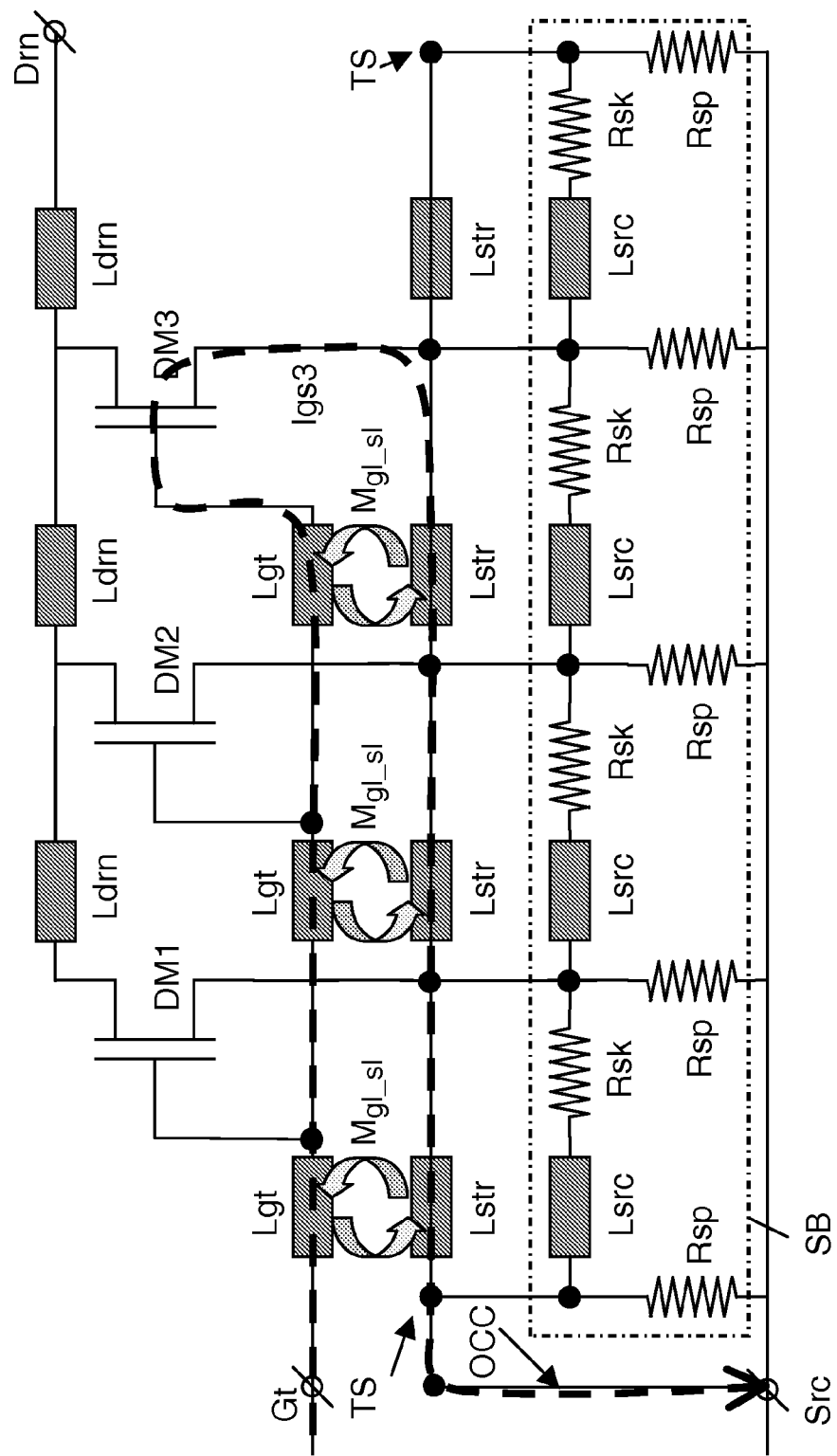
FIG. 8 shows an equivalent circuit of a further embodiment of the field-effect transistor in accordance with the invention in which a further improvement of power losses in the substrate is achieved.

In this invention it is proposed to reduce the power loss due to the inhomogeneous substrate currents by adding a strap line in close proximity to the gate and/or drain lines to provide an alternative route, preferably a low resistance route, for the gate and drain return currents. The strap line effectively connects all sources together (next to the semiconductor body and the substrate). The effect of this measure will be discussed on the basis of FIGS. 7a, 7b and 8. The discussion is done while focusing on the main differences. FIG. 7a shows an equivalent circuit of an embodiment of the field-effect transistor in accordance with the invention in which power losses caused by the gate line return current problems in the substrate at higher operating frequencies are resolved. FIG. 7b shows an equivalent circuit of the same embodiment of the field-effect transistor as FIG. 7a in which power losses caused by the drain line return current problems in the substrate at higher operating frequencies are also resolved. FIG. 8 shows an equivalent circuit of a further embodiment of the field-effect transistor in accordance with the invention in which a further improvement of power losses in the substrate is achieved. In FIGS. 7a, 7b, and 8 the strap line is modeled as a distributed inductance (illustrating that it preferably has a low resistance). Preferably, the strap line is provided near the gate line and/or drain such that it has a stronger coupling with those lines than the semiconductor body SB. In general a stronger coupling may be achieved by putting the strap line closer to the gate line and/or drain line. This stronger coupling then results in a stronger mutual inductance $M_{g1\_s1}$, $M_{d1\_s1}$. Even though, it has already been mentioned that the invention may be applied to the gate line, the drain line or both, in the remaining part of the description the invention will be applied to both lines (this is generally the optimal solution), notwithstanding the possibility of doing it differently. The interesting advantage of having gate lines and drain lines as part of interleaved fork structures is that the strap line may be advantageously placed in between the gate and drain lines. This solves the problem for both lines simultaneously. In FIGS. 7a and 7b the substrate current still has to flow through the substrate plugs Rsp at the end of the transmission lines (left and right one in the Figures). The power loss may be further improved by providing a bypass for this plug Rsp as well. This is illustrated in FIG. 8. The ends of the strap line may be connected to strap line terminals TS. When these strap line terminals TS are electrically connected with the source terminal Src by means of a low-impedance connection OCC it may be prevented that the return currents still flow through the substrate plugs Rsp. The low-impedance connection OCC may be an off-chip connection, i.e. a bondwire, or an on-chip connection (an additional low-impedance path parallel to the substrate plugs, which may be located in a region outside the region of the main current paths DM1, DM2, DM3, for example below an existing bondpad. FIG. 8 only shows a connection on the gate side of the circuit. However, it may also be provided on the drain side, and preferably it is provided on both sides.

Figure 9:
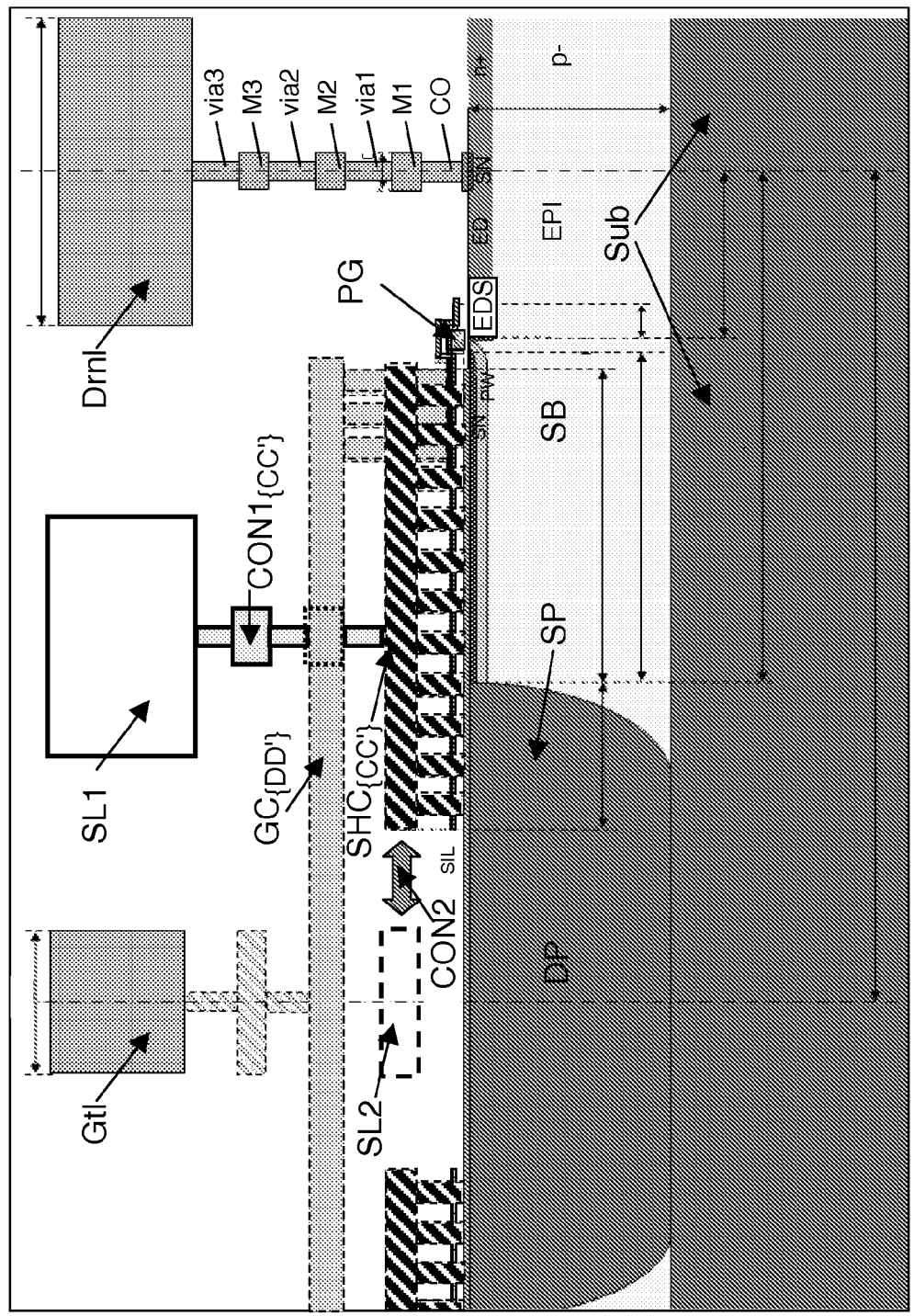
FIG. 9 shows combined schematic cross-sectional view of an embodiment of the field-effect transistor in accordance with the invention through lines BB', CC', and DD' in FIG. 3.

FIG. 9 shows combined schematic cross-sectional view of an embodiment of the field-effect transistor in accordance with the invention through lines BB', CC', and DD' in FIG. 3. This Figure will be discussed in as far as it differs from FIG. 4. This Figure illustrates possible locations SL1, SL2 where the strap line may be laid out. A first location SL1 is in between the gate line Gtl and the drain line Drnl in the top metal layer. The advantage of this location is that the problem is solved for both the gate return currents as well as the drain return currents. An interesting aspect of the first location SL1 is that a connection to the source region is easily established by providing a connection CON1 to the shield connections SHC. Such a connection CON1 may be made of a stack of vias and metal polygons. The second location SL2 is in the first metal layer in between the shield connections SHC. The connection between the strap line and the shield connection is very straightforward because both parts are located in the same metal layer. A disadvantage of this location is that it results in a weaker coupling between the strap line and the drain line. A combination of both locations may result in the best performance. The use of many contacts in the shield connection ensures a low-ohmic contact to source.

Figure 10:
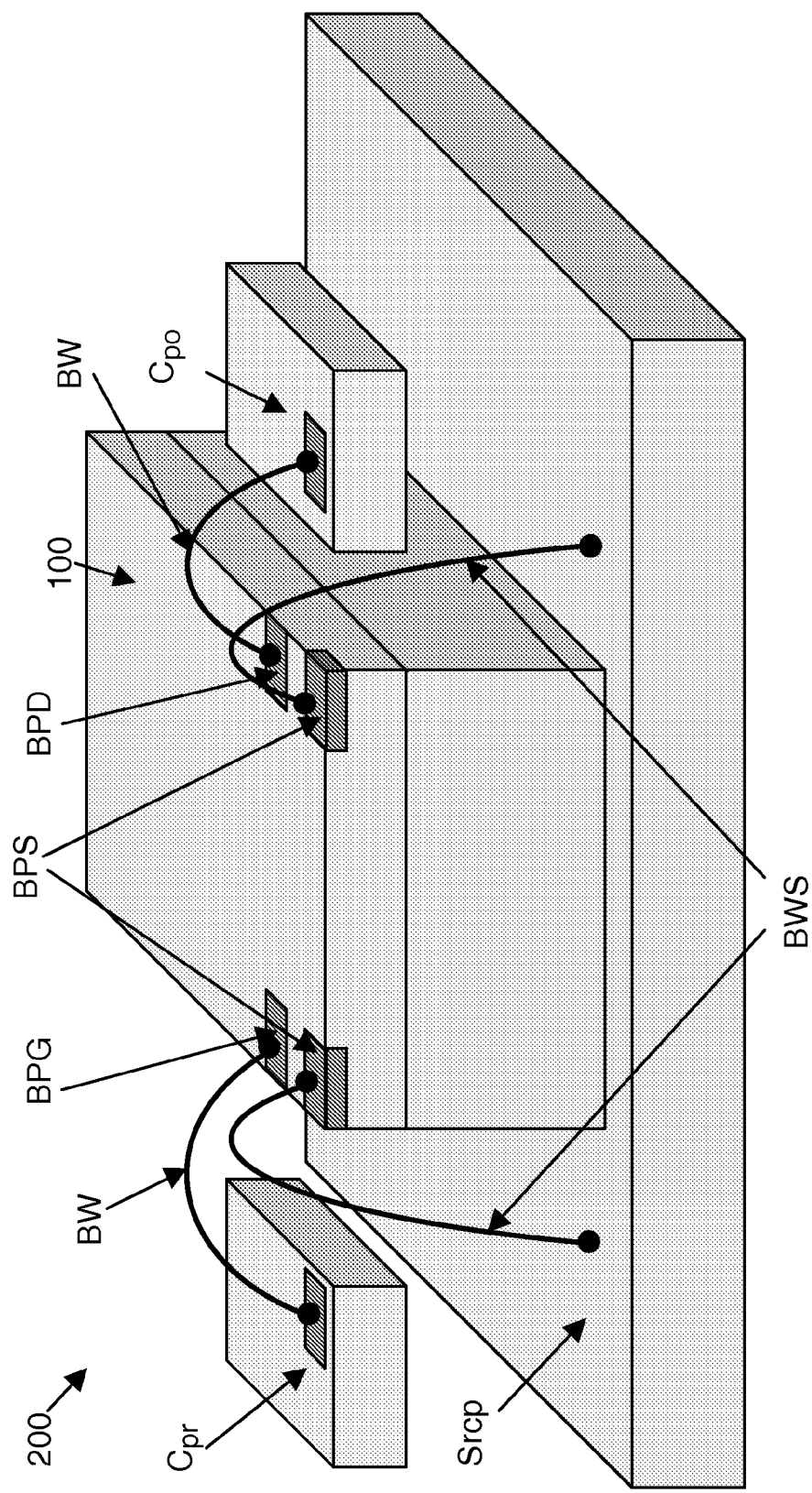
FIG. 10 shows a 3D schematic view of part of a discrete packed field-effect transistor in accordance with an embodiment of the invention.

FIG. 10 shows a 3D schematic view of part of a discrete packed field-effect transistor in accordance with an embodiment of the invention. This Figure must be interpreted in view of FIGS. 2a and 2b and serves to explain an advantageous embodiment of the invention as already discussed in view of FIG. 8. Nevertheless, not all features of FIGS. 2a and 2b are shown in FIG. 10. FIG. 10 shows the source plate Srcp with the die 100 provided thereon. Also, lumped capacitances $C_{pr}$, $C_{po}$ of the impedance matching network are shown. The die 100 is provided with gate bondpads BPG connected with the gate lines, drain bondpads BPD connected with the drain lines, and source bondpads BPS connected with the strap lines. The gate and drain bondpads are connected to other parts of the discrete device by means of bondwires BW. In order to prevent the RF return currents to still flow through the substrate plugs the source bondpads may be connected to the electrically conductive source plate Srcp by means of a source bondwire BWS.

Figure 11A:
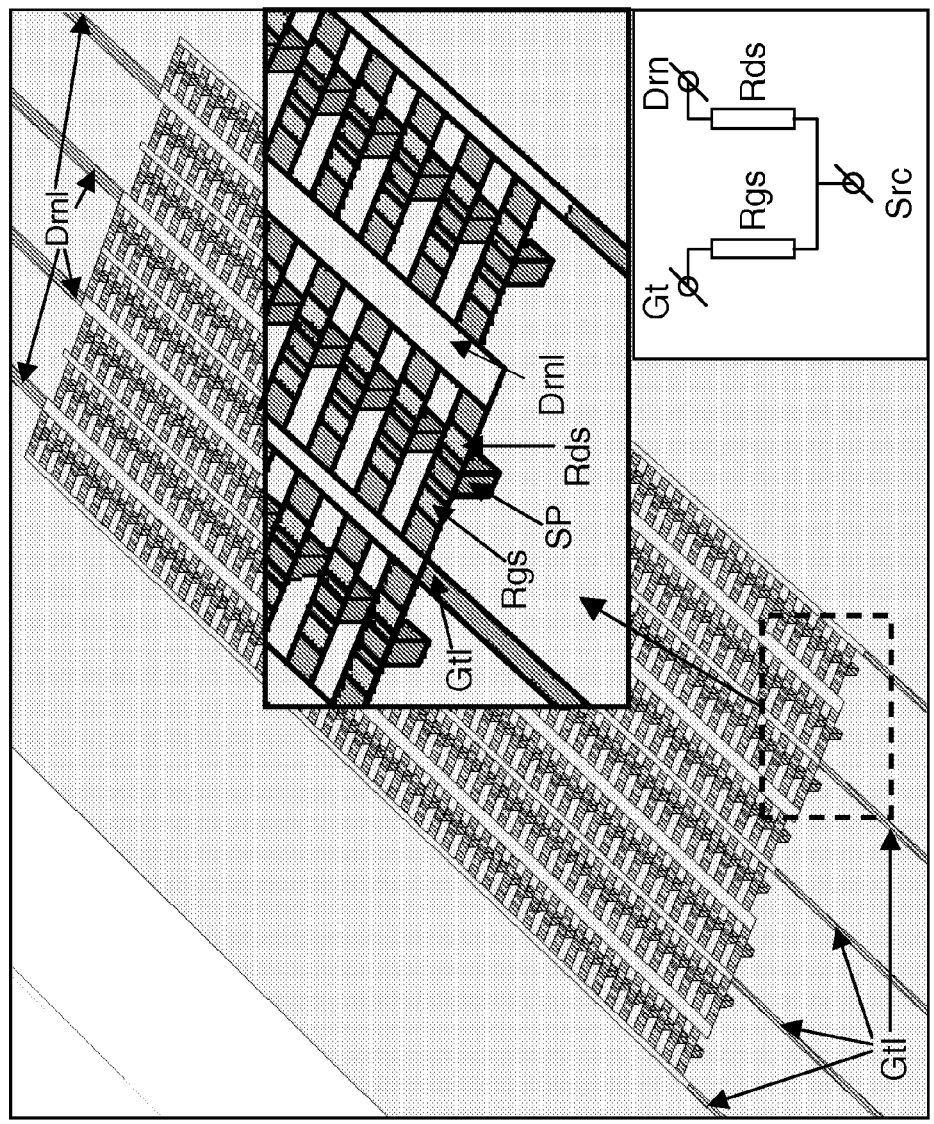
FIG. 11a shows a Sonnet EM model of a reference transistor where only gate and drain are connected using a top metal layer.
Figure 11B:
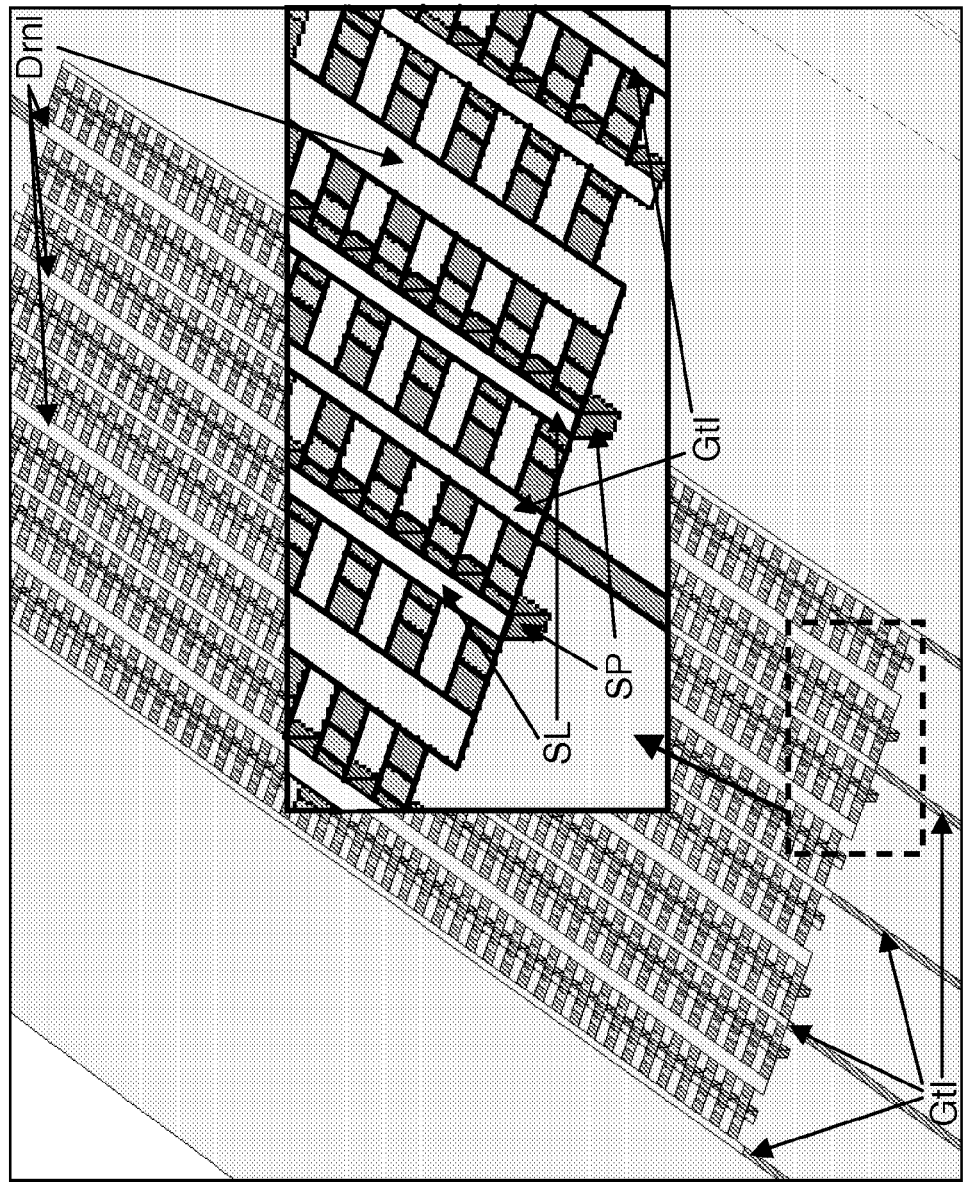
FIG. 11b shows a Sonnet EM model of a preferred embodiment of the field-effect transistor in accordance with the invention where also the source is connected using the thick top metal layer.

FIG. 11a shows a Sonnet EM model of a reference transistor where only gate and drain are connected using a top metal layer. FIG. 11b shows a Sonnet EM model of a preferred embodiment of the field-effect transistor in accordance with the invention where also the source is connected using the thick top metal layer. It must be noted that FIG. 11a and FIG. 11b are not 3D views of the transistor. Both Figures comprise a zoom view of the model indicated by the dashed box, the arrow and the enlarged picture. In FIGS. 11a and 11b the gate lines Gtl and drain lines Drnl are shown as parallel interleaved lines. In the Sonnet EM model each main current path is modeled with a gate-source resistance Rgs between the gate Gt and source Src and a drain-source resistance Rds between the drain Drn and source Src. This simplified representation is shown in the bottom right corner of FIG. 11a. In both FIG. 11a and FIG. 11b the model is made for a transistor having 8 parallel fingers of 500 μm width each. For each main current path the substrate plug SP is modeled with a resistance (not shown in schematic). In the typical IC processes used for power amplifier transistors the best place to realize the strap line according to this invention is in the thick top metal layer used for global routing. In the models of FIG. 11a and FIG. 11b the top metal layer is assumed to be a 3 μm thick aluminum layer. The strap line is preferably placed between the gate and drain lines and have such a width that its DC resistance is at least comparable but preferably less than that seen in the gate and drain fingers, but should not be made so wide that the parasitic gate to source and drain to source interconnect capacitances are increased up to undesirable levels. This is illustrated in the Sonnet EM model of the reference transistor (FIG. 11a) where only the gate lines Gtl and the drain lines Drnl are connected using the thick top metal and in the Sonnet EM model of an embodiment of the transistor in accordance with the invention (FIG. 11b) where also the source is connected using the strap line SL in the thick top metal.

Figure 12:
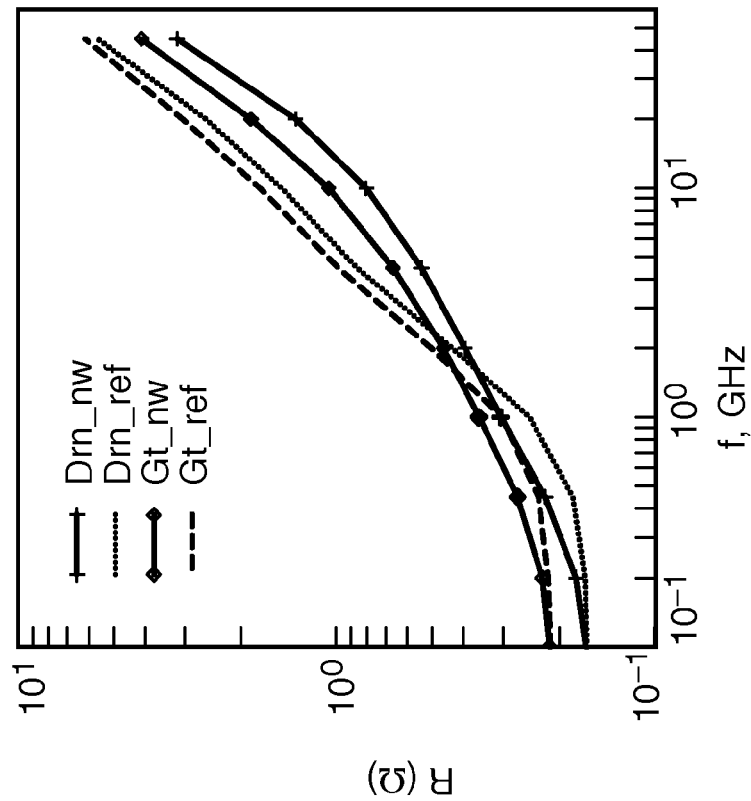
FIG. 12 shows a Sonnet EM simulated graph of the drain and gate interconnect resistance versus frequency using the Sonnet EM models of FIG. 11a and FIG. 11b.

FIG. 12 shows a Sonnet EM simulated graph of the drain and gate interconnect resistance versus frequency using the Sonnet EM models of FIG. 11a and FIG. 11b. The impact of the strap lines SL on the RF resistance seen between external gate Gt and external source Src and external drain Drn and external Source Src respectively, is shown in FIG. 12. This figure shows the gate resistance Gt_nw of the transistor in accordance with the invention, and the gate resistance Gt_ref of the reference transistor. It also shows the drain resistance Drn_nw of the transistor in accordance with the invention, and the drain resistance Drn_ref of the reference transistor. As can be seen, at frequencies of 2 GHz and above, the resistive losses are reduced since the currents now primarily flow in the (low-resistive) strap line instead of in the substrate/semiconductor body. In this particular example it is also seen that adding the strap line reduces the characteristic frequency at which the inhomogeneous currents in the substrate start to occur, as indicated by the increased resistance seen at about 300 MHz. However, the net effect of the invention is a beneficial reduction in resistive loss at the 2 GHz operating frequency and its harmonics.

Figure 13:
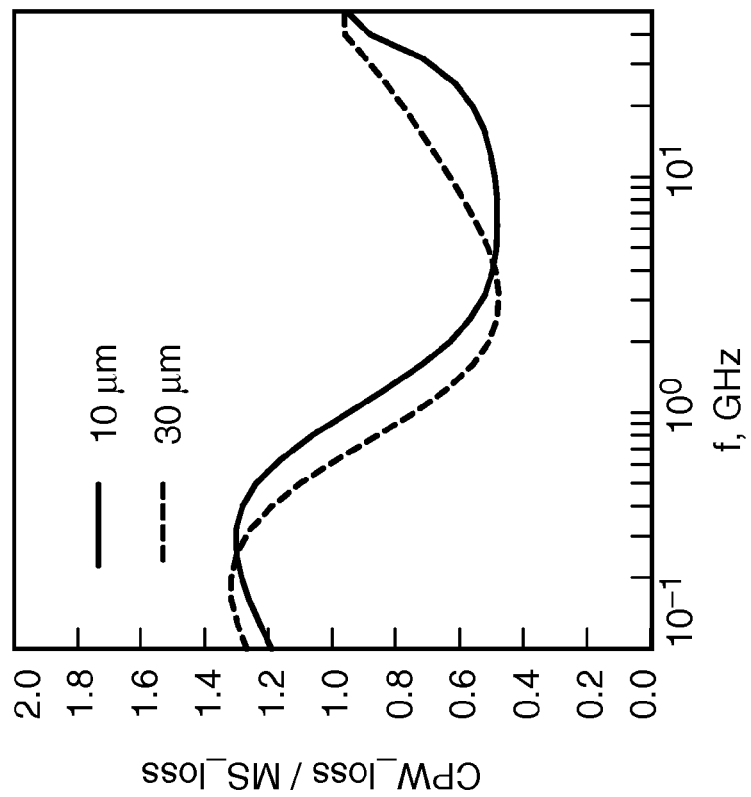
FIG. 13 shows a Sonnet EM simulated graph of the coplanar waveguide transmission line loss expressed as a fraction of the isolated (microstrip) interconnect line loss versus frequency.

It may happen that due to a fairly large substrate thickness of the transistor according to the invention not only the transistor interconnect lines but also the lines connecting various components of matching networks suffer from the earlier described current losses. This is illustrated in FIG. 13, which shows the simulated signal loss CPW_loss in a co-planar waveguide transmission line on a conductive substrate divided by the signal loss MS_loss simulated for an isolated (microstrip) interconnect transmission line with a signal conductor having the same width. From FIG. 13 it can be observed that, using a co-planar waveguide layout, with ground lines in the top metal level in close vicinity to the signal line, typically the signal loss is reduced by a factor of 2 at the operating frequency of 2 GHz.

Figure 14A:
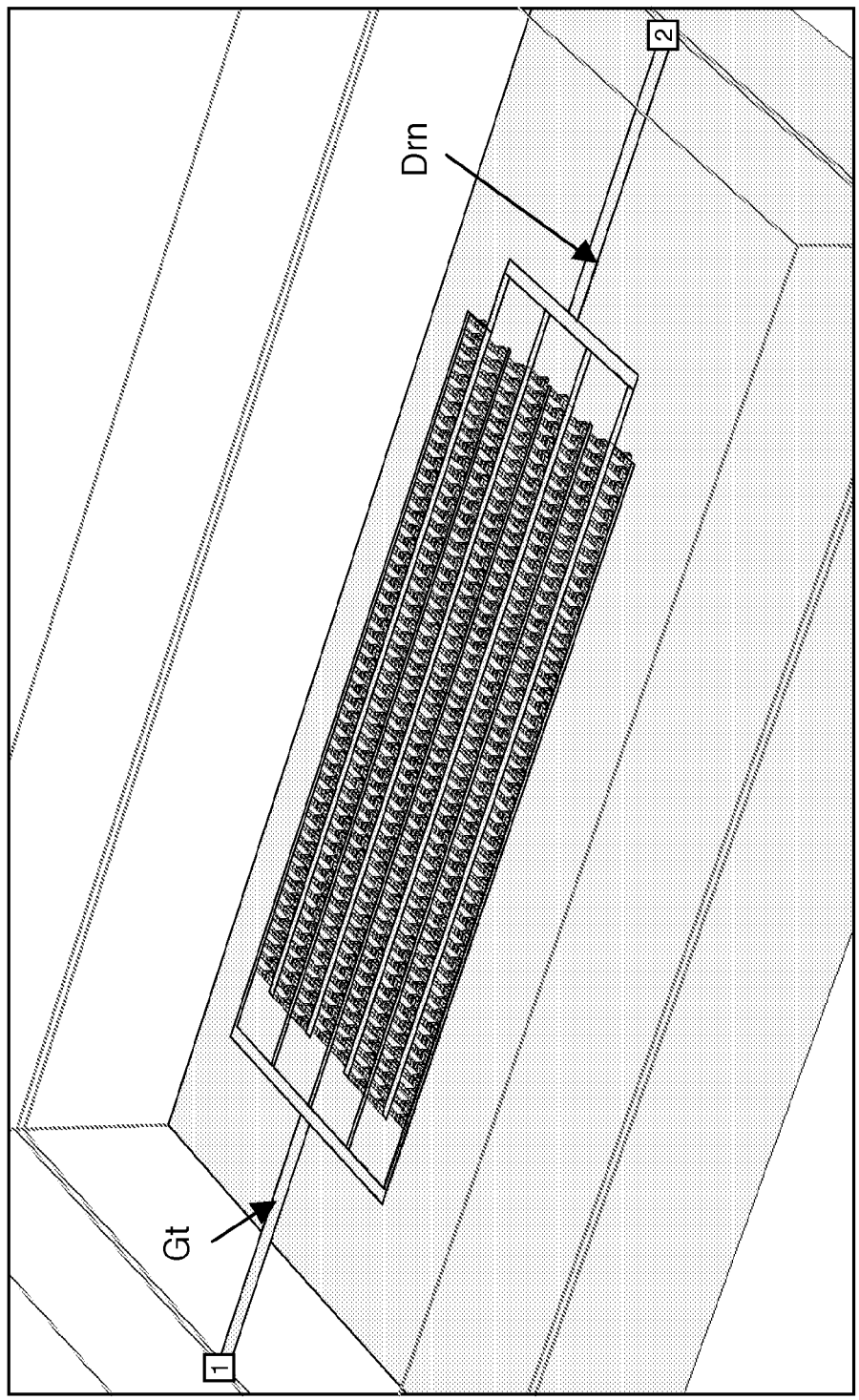
Figure 14B:
Figure 15:
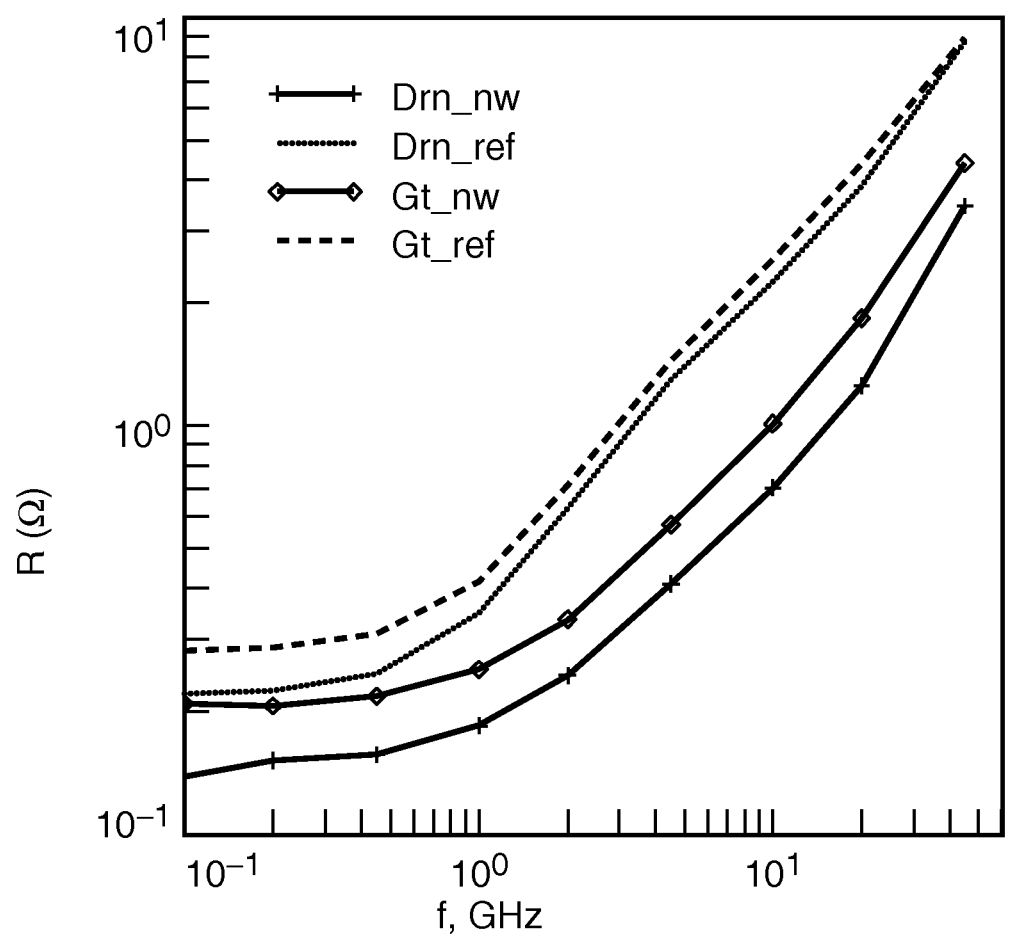
FIG. 15 shows a Sonnet EM simulated graph of the drain and gate interconnect resistance versus frequency for a reference transistor (FIG. 14a) and the transistor in accordance with the invention, for the case where the source straps can be connected to a global ground interconnect network realized in the top metal level.

It would therefore make sense to add a co-planar waveguide based global ground interconnect network to such a circuit to reduce these losses. Impedance matching inductors compatible with such an approach are possible. Under the assumption that such a design approach has been selected, the benefits of the (low-resistive) strap lines according to the invention are increased. This is illustrated by comparing the results of Sonnet EM simulations performed on the structures depicted in FIGS. 14a+b. FIGS. 14a and 14b show Sonnet EM models used to evaluate the impact of the strap lines in accordance with the invention when used in a multi-stage amplifier module where the these straps can be connected to a co-planar waveguide based global ground interconnect network realized in the top metal level, wherein FIG. 14a represents a reference transistor and FIG. 14b a transistor in accordance with the invention. In FIG. 14a the device is contacted by conventional interconnections Gt, Drn, whereas the device in FIG. 14b is contacted by a co-planar waveguide formed by the gate Gt and strap lines Src on one side and the drain Drn and strap lines Src on the other side. The interconnections Gt, Drn are embedded by two strap line interconnections Src so as to form a proper co-planar wave guide. The required underpass is preferably realized in a lower (i.e. M1) metal layer. The results of these simulations are depicted in FIG. 15 which shows a Sonnet EM simulated graph of the drain and gate interconnect resistance versus frequency for a reference transistor (FIG. 14a) and the transistor in accordance with the invention, for the case where the source straps are connected to a global ground interconnect network realized in the top metal level. FIG. 15 shows the gate resistance Gt_nw of the transistor in accordance with the invention, and the gate resistance Gt_ref of the reference transistor. It also shows the drain resistance Drn_nw of the transistor in accordance with the invention, and the drain resistance Drn_ref of the reference transistor. FIG. 15 demonstrates that once the source straps can be connected to a proper global ground also realized in the thick top metal layer, the reduction of the interconnect resistance is about a factor of two over the entire frequency range.

This invention relies on electromagnetic transmission line theory which as such is considered common general knowledge. Many books on electromagnetic transmission line theory are available, for example:

"Electromagnetism" by I. S. Grant and W. R. Philips (Wiley), chapter 9.

"Classical Electrodynamics" by J. D. Jackson (Wiley), chapter 8.

FIGS. 16 to 19 show schematical cross-sectional views of the field-effect transistor in accordance with other embodiments of the invention. In these Figures there is no merging of different cross-sectional views in order to facilitate the understanding of the invention. The shield extensions SHE (FIG. 4) and shield connections SHC (FIG. 4) have been left out, as well as the gate extensions PGE (FIG. 4) and gate connections GC (FIG. 4). It must be stressed that these drawings are not drawn to scale. Also, within each respective drawing certain parts may be drawn at a different scale than other parts in order to clarify the drawings. These Figures will be discussed only in as far as they differ from the embodiment in FIG. 9.

Figure 16:
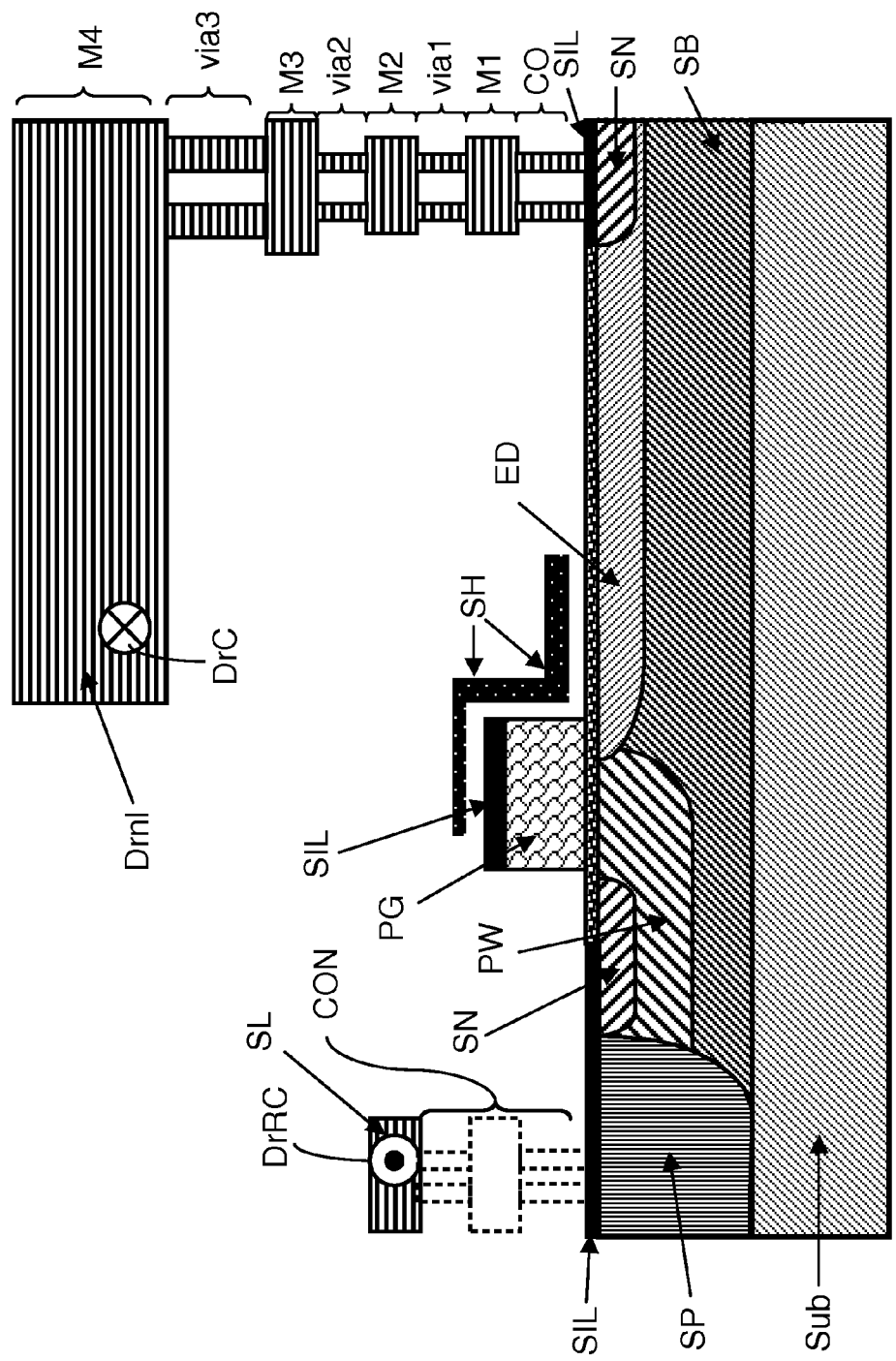
FIG. 16 shows a schematic cross-sectional view of the field-effect transistor in accordance with another embodiment of the invention.

FIG. 16 shows a schematic cross-sectional view of a first variant of the field-effect transistor in accordance with the invention. In this embodiment the strap line SL has been laid out in the second metallization layer M2 above the source plug SP. At certain locations the strap line SL is connected to the source region via connections CON and a silicide layer SIL. The connections CON comprise a stack of contacts/vias and metal polygons. In the drain line Drnl, which has been laid out in the top metallization layer M4, there is illustrated a drain current DrC. This drain current induces a drain return current DrRC in the strap line SL in an opposite direction as illustrated in FIG. 7b.

The configuration of FIG. 16. results in a certain coupling between the strap line SL and the drain line Drnl. It may be advantageous to further increase this coupling. This is achieved in FIG. 17 which shows a schematic cross-sectional view of a second variant of the field-effect transistor in accordance with the invention. In this embodiment the strap line SL has been laid out in the second metallization layer between the gate PG of the transistor and the drain line Drnl. The contacts CON between the strap line SL and the source plug SP are made in a way similar to FIG. 16, with the only difference that the strap line SL is provided with extensions at regular intervals that extend to above the source plug SP. These extensions are then further connected to the source plug via similar contacts/vias and metal polygons as FIG. 16. An advantage of this configuration is also that the gate PG and the shield SH can be easily connected at regular intervals which are interposed between the strap line extensions. The distance between the strap line SL and the drain line Drnl is significantly reduced and therefore the coupling is higher. Another advantage of this embodiment is that the drain line to gate coupling is reduced as the strap line SL shields the gate PG from the drain line Drnl. When this capacitance is reduced the stability of the transistor is increased (less oscillations). In the prior art the drain to gate coupling is also referred to as the feedback capacitance.

Figure 17:
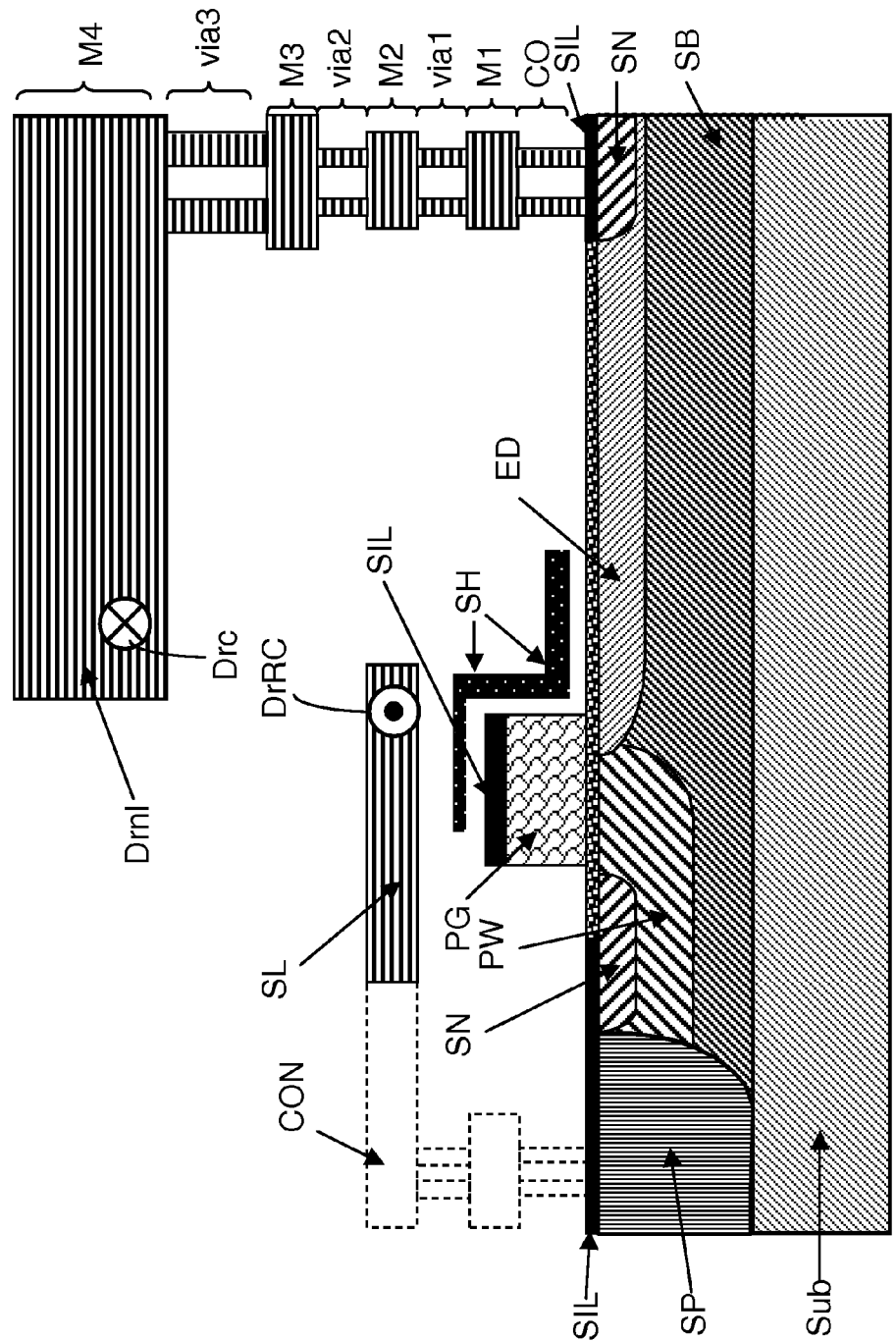
FIG. 17 shows a schematic cross-sectional view of the field-effect transistor in accordance with yet another embodiment of the invention.

The transistors of FIGS. 16 and 17 have been manufactured and tested. Clearly, the performance of the embodiment of FIG. 17 was better than that of FIG. 16. First of all, the output capacitance of the embodiment of FIG. 17 was larger (which implies that the inductance is smaller) and, second, the feedback capacitance was smaller (which means better stability). Load pull measurements (at 2.14 GHz and 2.6 GHz) have further confirmed that the embodiment of FIG. 17 has a higher efficiency and can provide a higher output power.

Figure 18:
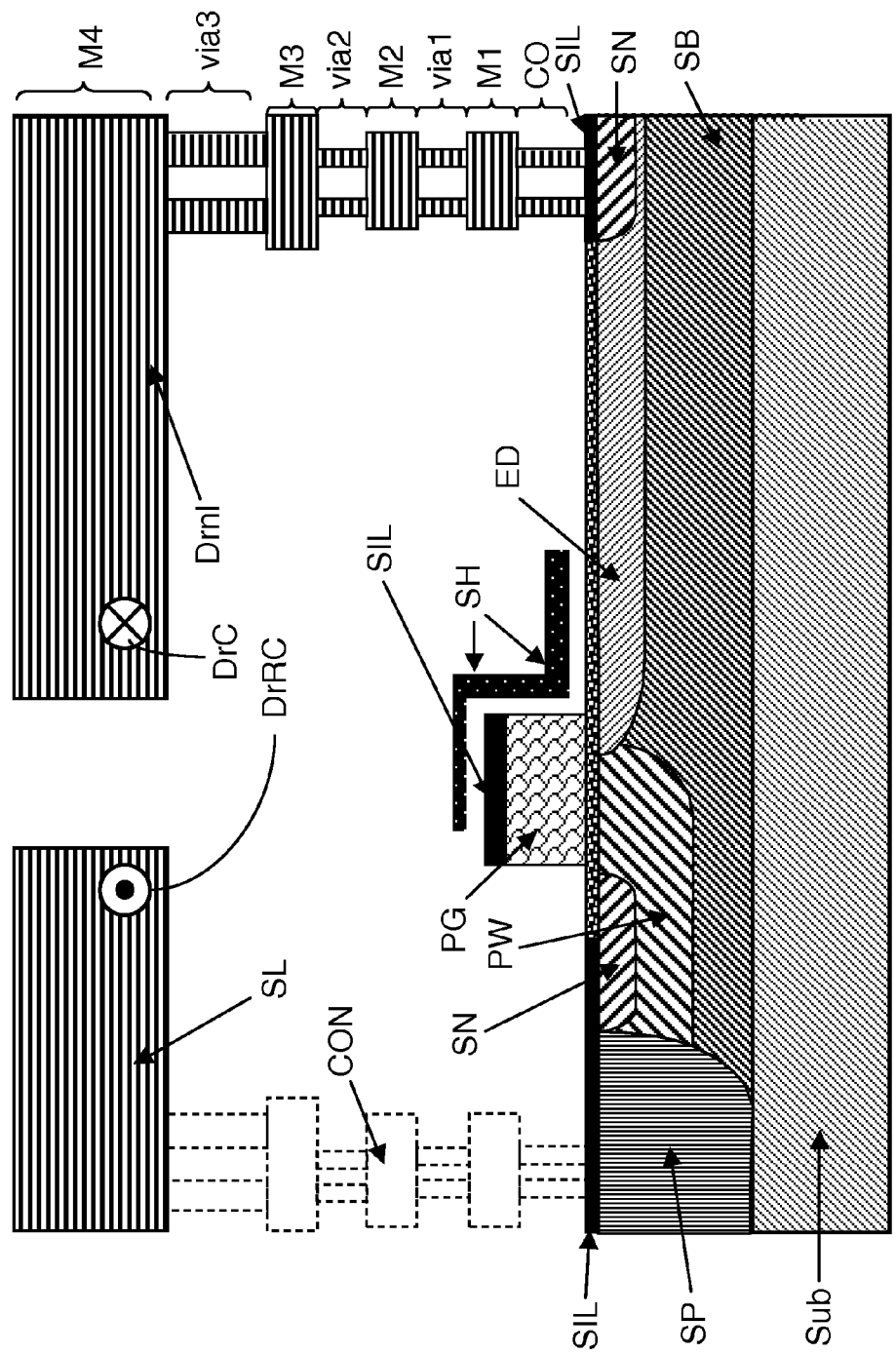
FIG. 18 shows a schematic cross-sectional view of the field-effect transistor in accordance with yet another embodiment of the invention.
Figure 19:
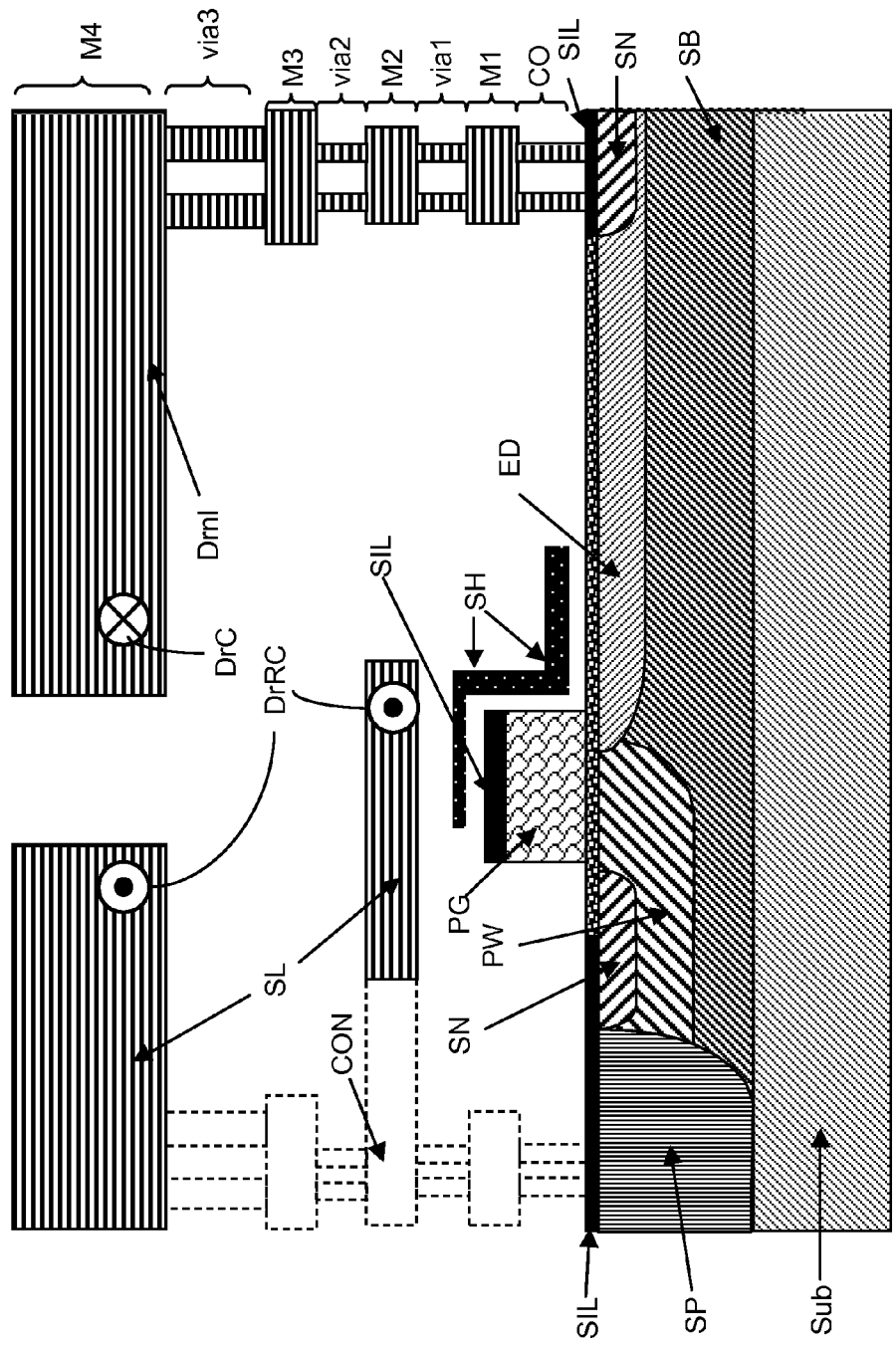
FIG. 19 shows a schematic cross-sectional view of the field-effect transistor in accordance with yet another embodiment of the invention.

FIG. 18 shows a schematic cross-sectional view of a third variant of the field-effect transistor in accordance with the invention. In this embodiment the coupling between the drain line Drnl and the strap line SL is further increased by implementing the strap line SL in the same top metal layer as the drain line Drnl. The top metal layer is thicker and therefore the mutual coupling capacitance between both lines is large (especially when they are routed at the minimum technology spacing). The connection CON between the strap line SL and the source plug SP is done similar to that of FIGS. 16 and 17. The only difference is that the stack of vias/contacts and polygons comprises more metal layers. A first advantage of this embodiment is that the inductive coupling between the strap line SL and the drain line Drnl is very strong. It must be noted that also the capacitive coupling is very strong, but the inductive coupling is more important for the performance. A second advantage of this embodiment is that the resistance of the strap line is smaller due to the top metal layer characteristics (and can be equal to the resistance of the drain line), which is better for the efficiency. It must be noted that in the embodiment in FIG. 18 the spacing between the strap line SL and the drain line Drnl is meant to be smaller than the spacing between the strap line SL and the gate line (not shown). Nevertheless, in a variation of the embodiment of FIG. 18, these spacings may be made equal. A first advantage of this variant is that the strap line to gate line coupling is increased (better gain). A second advantage of this variant is that the strap line resistance is further reduced (which is beneficial for the efficiency).

A possible disadvantage of the embodiment of FIG. 18 is that the feedback capacitance is higher than that of FIG. 17. Nevertheless, the embodiments of FIG. 17 and FIG. 18 can be easily combined, which leads to embodiment of FIG. 19 which shows a schematic cross-sectional view of a fourth variant of the field-effect transistor in accordance with the invention. Experiments have confirmed that the embodiments of FIGS. 18 and 19 have a comparable (but better than FIGS. 16 and 17) performance.

Even though the example embodiments in FIGS. 16 to 19 illustrate a metallization stack with 4 layers, in practise this can be any number of interconnect layers. It must be stressed that there is a clear trend visible in the number of metallization layers. This trend shows a continuing increase in the number of metallization layers. Nevertheless, it is quite common that the upper layers of a metallization stack are typically thicker and wider than the lower layers. It is these layers in which the drain lines, gate lines and strap lines are preferably laid out. Nevertheless, this is not essential.

The invention may be applied in various application areas. For example, the invention may be applied in discrete power amplifier transistors and multistage amplifier circuits. Two major benefits may be identified in these applications. First of all, reduction of resistive losses which enable a higher amplifier (module) efficiency, and secondly, in accordance with an embodiment of the invention, the use of well defined ground pins and a co-planar waveguide based global ground network realized in the thick top metal level will make the performance of circuits more predictable since it allows one to build such a large circuit from well defined building blocks with well defined interfaces. The invention would also be very useful in power amplifier modules where several amplification stages connected by suitable L/C impedance matching networks are integrated on a single die. Even though a large part of the description deals with high-voltage tolerant LDMOS transistor, the invention is definitely not restricted to such kind of transistors only.

Various variations of the semiconductor device and electronic system in accordance with the invention are possible and do not depart from the scope of the invention as claimed. These variations for example relate to conductivity types of semiconductor layers/regions. N-type and p-type may be swapped in order to obtain PMOST devices rather than NMOST devices for example. Such alterations fall within the normal routine of the person skilled in the art.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. Use of the verb "comprise" and its conjugations does not exclude the presence of elements or steps other than those stated in a claim. The article "a" or "an" preceding an element does not exclude the presence of a plurality of such elements. The invention may be implemented by means of hardware comprising several distinct elements, and by means of a suitably programmed computer. In the device claim enumerating several means, several of these means may be embodied by one and the same item of hardware. The mere fact that certain measures are recited in mutually different dependent claims does not indicate that a combination of these measures cannot be used to advantage. Throughout the Figures, similar or corresponding features are indicated by same reference numerals or labels.

The invention claimed is:

1. A field-effect transistor comprising:
a source terminal;
an electrically conductive substrate being electrically connected to the source terminal;
a semiconductor body being provided on the conductive substrate and comprising a transistor structure;
a gate line, and
a drain line,
wherein the transistor structure comprises a plurality of main current paths for a main transistor current, each respective one of the main current paths comprising a respective drain, a respective source, and a respective channel in between the respective drain and respective source, wherein the respective channel is controlled by a respective gate, wherein each respective drain is electrically connected to the drain line, wherein each respective source is electrically connected to the conductive substrate, wherein each respective gate is electrically connected to the gate line, wherein the semiconductor body embodies an RF-return current path to the source terminal, wherein the RF-return current path is for an RF-return current in an opposite direction than the main transistor current, wherein the sources of the plurality of main current paths are electrically connected by means of a strap line, wherein the strap line is disposed between the gate line and the drain line in a common metallization layer and inductively coupled to the gate line and the drain line to form an additional RF-return current path parallel to the RF-return current path in the semiconductor body, wherein the additional RF-return current path is for the RF-return current in the opposite direction than the main transistor current.

2. The field-effect transistor as claimed in claim 1, wherein the strap line is arranged parallel to the gate line and/or the drain line 3. The field-effect transistor as claimed in claim 1, further comprising a metallization stack on the semiconductor body, wherein the metallization stack comprises a top-metallization layer that is at a largest distance from the semiconductor body, wherein the gate line and the drain line have been laid out in the top-metallization layer.

4. The field-effect transistor as claimed in claim 3, wherein the strap line is laid out in the top-metallization layer.

5. The field-effect transistor as claimed in claim 3, wherein the strap line is laid out in a lower metallization layer that is at a shorter distance from the semiconductor body than the top-metallization layer.

6. The field-effect transistor as claimed in claim 5, wherein the strap line is laid out in the lower metallization layer substantially above the gates of the transistor structure for shielding the gates from the drain line.

7. The field-effect transistor of claim 1, further comprising a gate line connection, a drain line connection, and strap line connections, wherein the gate line connection and/or the drain line connection are formed as a coplanar waveguide using the strap line connections as RF-return current path.

8. The field-effect transistor of claim 7, further comprising a co-planar waveguide based global ground network to which ends of the strap line connections are connected.

9. The field-effect transistor as claimed in claim 1, further comprising an electrically conductive source plate serving as an external source connection for the transistor onto which the electrically conductive substrate is mounted to.

10. The field-effect transistor as claimed in claim 9, further comprising a further source terminal at the surface of the semiconductor body, the further source terminal being connected to the strap line for allowing the RF-return current to further bypass the semiconductor body when the further source terminal is externally electrically connected to the source terminal.

11. The field-effect transistor as claimed in claim 10, further comprising an off-chip connection between the further source terminal and the conductive source plate.

12. A field-effect transistor package comprising:
the field-effect transistor as claimed in claim 1;
an electrically insulating material provided on the electrically conductive source plate;
an electrically conductive drain plate provided on the electrically insulating material to serve as external drain connection for the transistor;
an electrically conductive gate plate to serve as external gate connection for the transistor;
a plurality of lumped capacitances, and
a plurality of electrical connections between the plates and the field-effect transistor, wherein parasitic inductance of the plurality of electrical connections forms together with the plurality of lumped capacitances impedance matching networks.

13. A power amplifier comprising the field-effect transistor according to claim 1.

14. The power amplifier according to claim 13, further comprising one or more amplification stages connected by one or more suitable L/C impedance matching networks.

15. An integrated multi-stage power amplifier module comprising one or more field-effect transistors according to claim 1, an impedance matching circuitry comprising spiral inductors and capacitors, and biasing circuitry.

16. A cellular base station comprising the MOS transistor according to claim 1.

17. A cellular base station comprising the power amplifier according to claim 13.

* * * * *